(12) United States Patent
Kelly et al.

(10) Patent No.: US 11,101,149 B2
(45) Date of Patent: Aug. 24, 2021

(54) SEMICONDUCTOR FABRICATION WITH ELECTROCHEMICAL APPARATUS

(71) Applicant: TAIWAN SEMICONDUCTOR MANUFACTURING CO., LTD., Hsinchu (TW)

(72) Inventors: Andrew Joseph Kelly, Hsinchu County (TW); Yusuke Oniki, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/933,727

(22) Filed: Jul. 20, 2020

(65) Prior Publication Data
US 2020/0350185 A1 Nov. 5, 2020

Related U.S. Application Data

(60) Continuation of application No. 16/673,777, filed on Nov. 4, 2019, now Pat. No. 10,720,344, which is a
(Continued)

(51) Int. Cl.
*H01L 21/00* (2006.01)
*H01L 21/67* (2006.01)
(Continued)

(52) U.S. Cl.
CPC ........ *H01L 21/67086* (2013.01); *B82Y 10/00* (2013.01); *C25D 17/00* (2013.01); *C25F 3/12* (2013.01); *C25F 7/00* (2013.01); *H01L 21/02233* (2013.01); *H01L 21/02258* (2013.01); *H01L 21/28158* (2013.01); *H01L 21/3063* (2013.01); *H01L 21/30635* (2013.01); *H01L 29/41725* (2013.01); *H01L 29/41791* (2013.01); *H01L 29/42392* (2013.01); *H01L 29/66439* (2013.01); *H01L 29/66545* (2013.01); *H01L 29/66553* (2013.01); *H01L 29/66742* (2013.01); *H01L 29/66795* (2013.01); *H01L 29/66818* (2013.01); *H01L 29/775* (2013.01); *H01L 29/785* (2013.01); *H01L 29/78684* (2013.01); *H01L 29/78696* (2013.01);
(Continued)

(58) Field of Classification Search
None
See application file for complete search history.

(56) References Cited

U.S. PATENT DOCUMENTS 8,796,666 B1 8/2014 Huang et al.
8,815,712 B2 8/2014 Wan et al.
(Continued)

*Primary Examiner* — Reema Patel
(74) *Attorney, Agent, or Firm* — Maschoff Brennan

(57) ABSTRACT

A method includes depositing a plurality of first semiconductor layers and a plurality of second semiconductor layers over a substrate, wherein the first semiconductor layers and the second semiconductor layers are stacked alternately; patterning the first and second semiconductor layers to form a fin structure; supplying a first bias to the substrate after patterning the first and second semiconductor layers; and etching the second semiconductor layers when the semiconductor substrate is supplied with the first bias, wherein etching the second semiconductor layers is performed such that the first semiconductor layers are suspended above the substrate.

20 Claims, 25 Drawing Sheets

Related U.S. Application Data division of application No. 15/717,918, filed on Sep. 27, 2017, now Pat. No. 10,468,275.

(51) Int. Cl.

| | |
|---|---|
| H01L 21/3063 | (2006.01) |
| H01L 29/66 | (2006.01) |
| H01L 21/28 | (2006.01) |
| H01L 21/02 | (2006.01) |
| H01L 29/423 | (2006.01) |
| B82Y 10/00 | (2011.01) |
| C25F 3/12 | (2006.01) |
| H01L 29/417 | (2006.01) |
| C25F 7/00 | (2006.01) |
| H01L 29/775 | (2006.01) |
| H01L 29/786 | (2006.01) |
| H01L 29/78 | (2006.01) |
| C25D 17/00 | (2006.01) |
| H01L 29/06 | (2006.01) |
| H01L 29/51 | (2006.01) |

(52) U.S. Cl.
CPC .. *H01L 21/02236* (2013.01); *H01L 21/02238* (2013.01); *H01L 21/02241* (2013.01); *H01L 29/0673* (2013.01); *H01L 29/513* (2013.01); *H01L 29/665* (2013.01); *H01L 29/7853* (2013.01)

(56) References Cited

U.S. PATENT DOCUMENTS

| | | | |
|---|---|---|---|
| 8,963,258 | B2 | 2/2015 | Yu et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,576,814 | B2 | 2/2017 | Wu et al. |
| 2017/0077232 | A1* | 3/2017 | Balakrishnan .... H01L 29/66787 |

* cited by examiner

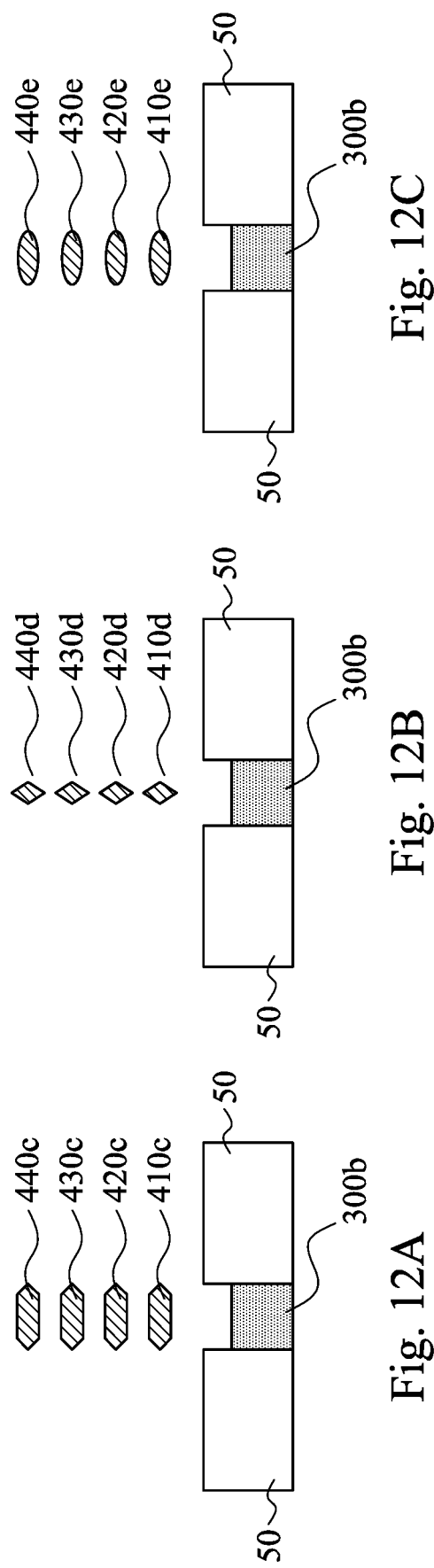

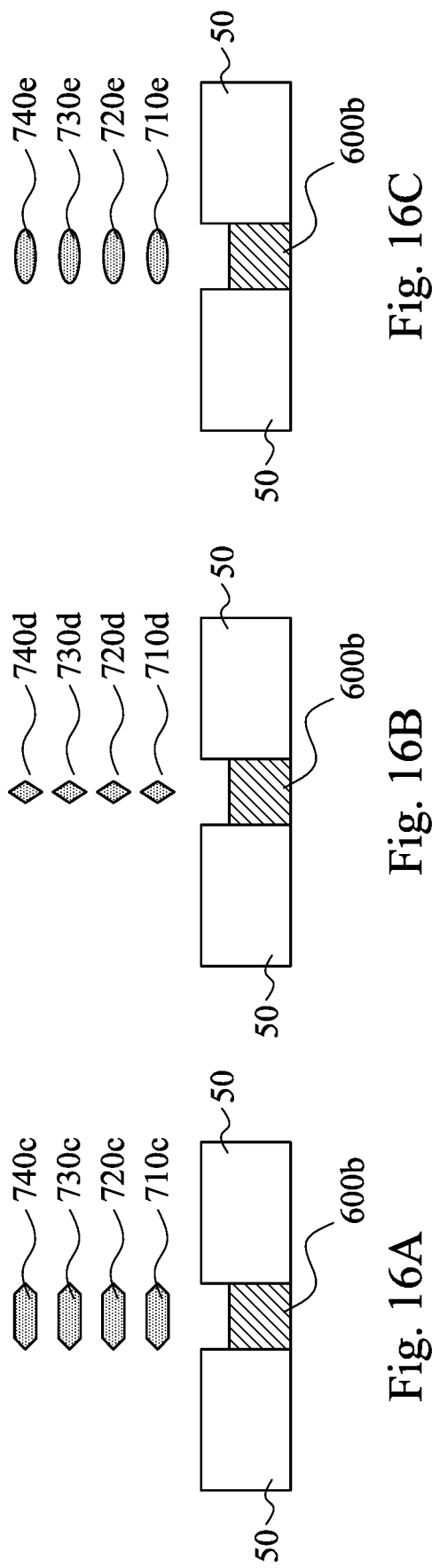

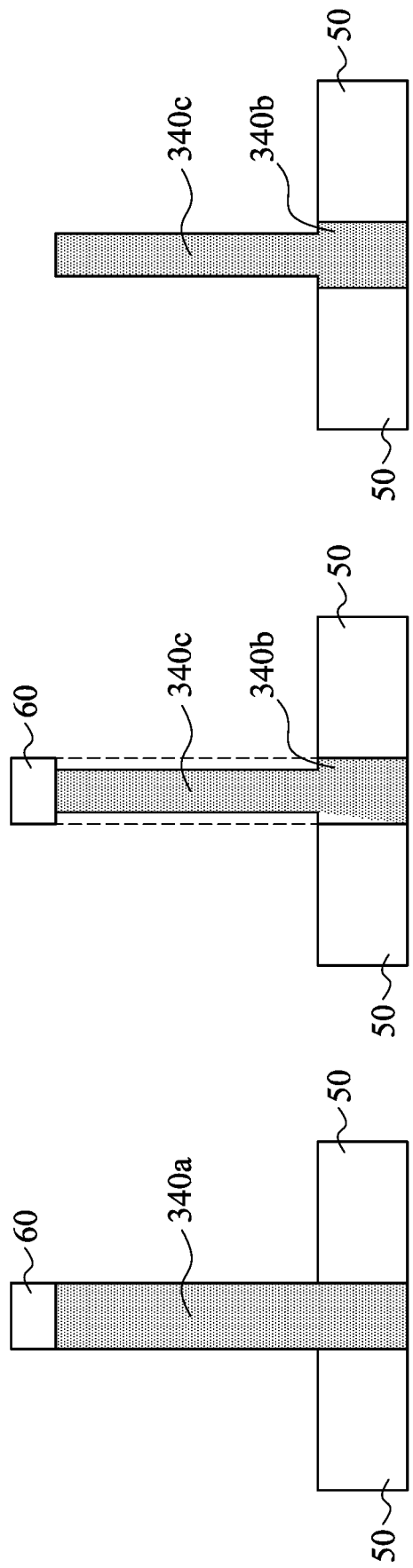

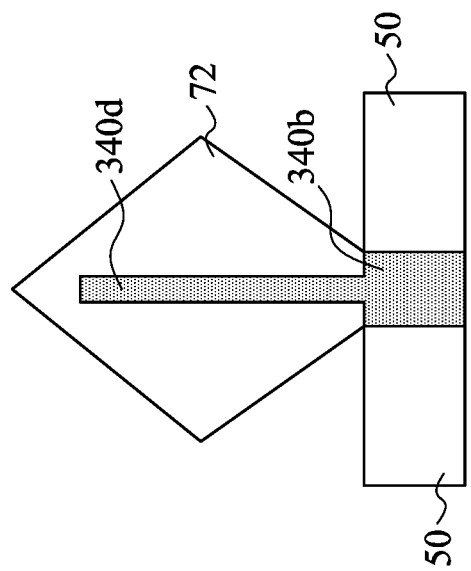
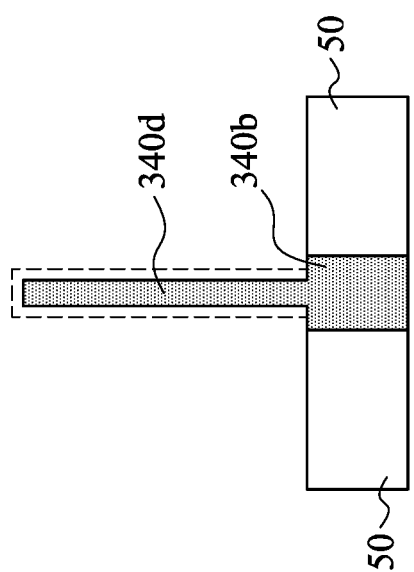
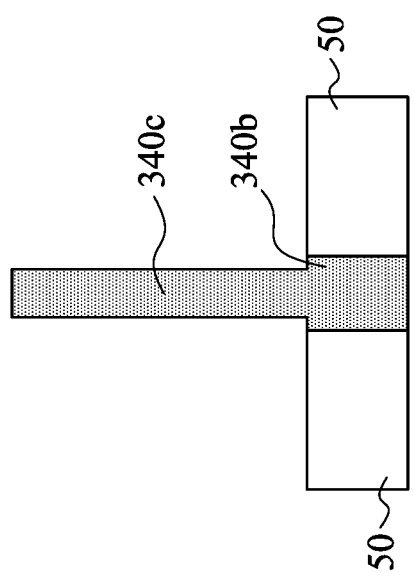

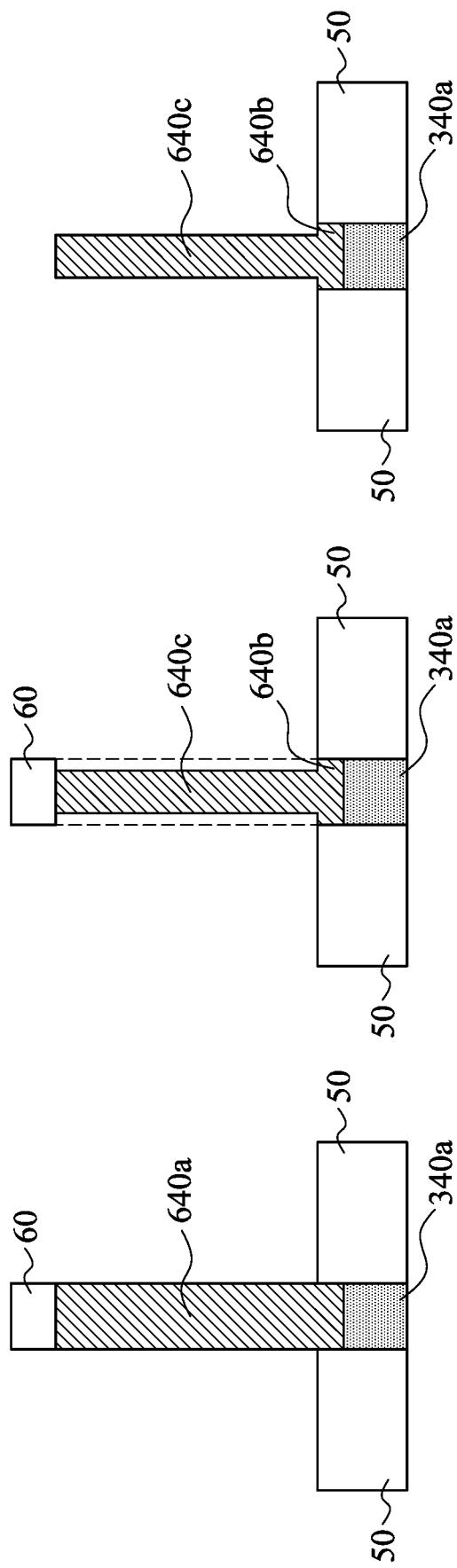

SEMICONDUCTOR FABRICATION WITH ELECTROCHEMICAL APPARATUS

PRIORITY CLAIM AND CROSS-REFERENCE

The present application is a continuation application of the application Ser. No. 16/673,777, filed on Nov. 4, 2019, now U.S. Pat. No. 10,720,344, issued Jul. 21, 2020, which is a divisional application of the application Ser. No. 15/717,918, filed on Sep. 27, 2017, now U.S. Pat. No. 10,468,275, issued Nov. 5, 2019, the entirety of which is incorporated by reference herein in their entireties.

BACKGROUND

During the fabrication of a semiconductor device, the semiconductor substrate goes through different cycles of process. Very often the surface of the semiconductor substrate requires oxidation, etching or native oxide removal. The surface of semiconductor substrate may be treated by, for example introducing atomic hydrogen at high temperature to remove native oxide, wet chemical oxidation that involves rinsing the semiconductor substrate with liquid, and digital etching process which needs to be switched between different reaction conditions.

However, when the substrate contains silicon, germanium, silicon germanium or other III-V element, high temperature treatment may result in additional metallic species formation on the semiconductor substrate. The wet chemical oxidation process produces an oxide film that has poor stoichiometry. Digital etching requires complicate switching between, for example $O_3/H_2O$ and $HF/H_2O$. Thus, a more efficient and effective approach is needed to perform oxidation/removal of the semiconductor substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 12A through 12C are cross-sectional views illustrating different configurations of nanowires with electrochemical apparatus on a semiconductor substrate having silicon in accordance with some embodiments of the instant disclosure;

FIGS. 16A through 16C are cross-sectional views illustrating different configurations of nanowires with electrochemical apparatus on a semiconductor substrate having silicon germanium in accordance with some embodiments of the instant disclosure;

FIGS. 18A through 18C are cross-sectional views illustrating trimming of semiconductor fin having silicon with electrochemical apparatus in accordance with some embodiments of the instant disclosure;

FIGS. 19A through 19C are cross-sectional views illustrating processing semiconductor fin having silicon with electrochemical apparatus in accordance with some embodiments of the instant disclosure;

FIGS. 20A through 20C are cross-sectional views illustrating trimming of semiconductor fin having silicon germanium with electrochemical apparatus in accordance with some embodiments of the instant disclosure;

DETAILED DESCRIPTION

Figure 1:
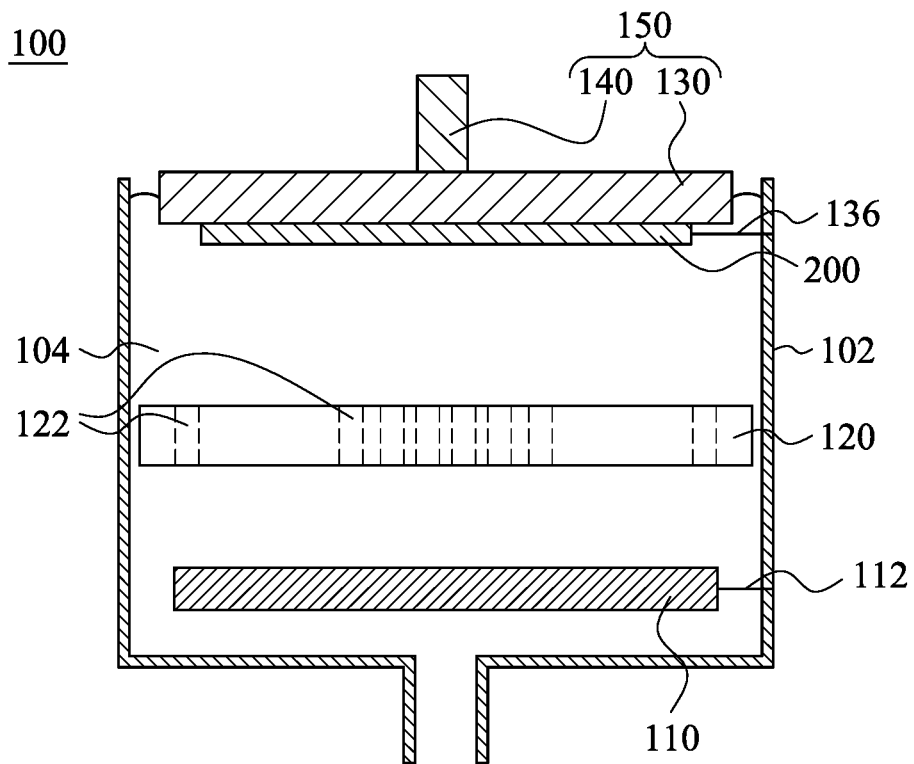
FIG. 1 is a cross-sectional view of an electrochemical apparatus including a high resistance virtual counter electrode therein in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Semiconductor substrate undergoes various processing steps before it is ready to function as a component of a larger device. These processing steps sometimes result in unwanted residues formed on the semiconductor substrate surface, and the cleaning process before the substrate moves on to the next stage can have pivotal effect to the final device performance. An electrochemical apparatus that allows particle removal from the substrate surface and also particle addition to the substrate is elaborated hereinafter.

Reference is made to FIG. 1, illustrating a cross-sectional view of an electrochemical apparatus 100 including a counter electrode 110, a high resistance virtual counter electrode 120 and a substrate holder 150 therein in accordance with some embodiments of the present disclosure. The reaction cell 102 from the bottom to top are the actual counter electrode 110, the high resistance virtual counter electrode 120 spaced apart from the actual counter electrode 110, and the substrate holder 150 suspending over the high resistance virtual counter electrode 120. The substrate holder 150 has a substrate mounting assembly 130 and a rotatable spindle 140 connected to the substrate mounting assembly 130. The rotatable spindle 140 may rotate clockwise or anti-clockwise, and the rotation speed is also adjustable. The high resistance virtual counter electrode 120 has a plurality of through holes 122 that allows electric flux going through the high resistance virtual counter electrode 120. In some embodiments, the through holes 122 are distributed in varied density. For example, the through holes 122 may be more densely arranged in the central portion of the high resistance virtual counter electrode 120, and the number of through holes 122 is less in the peripheral portion of the high resistance virtual counter electrode 120. The high density of through holes 122 in the central portion allows higher volume of electrical current to go through. Due to lower density of through holes 122 in the peripheral portion of the high resistance virtual counter electrode 120, a smaller volume of electrical current goes through this area. By adjusting the density of through holes 122, the rate of particle removal or deposition at different areas of the semiconductor wafer may also be controlled. In some embodiments, the electrochemical apparatus 100 further includes other functional elements, such as a diffuser, an electroplating solution inlet tube, a rinse drain line, an electroplating solution return line, any other functional element or a combination thereof.

Figure 2:
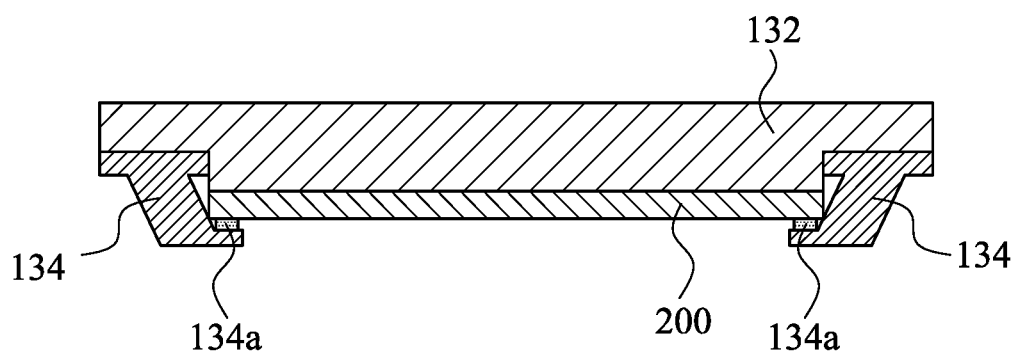
FIG. 2 is a cross-sectional view of a substrate holder of an electrochemical apparatus including a contact ring holding a semiconductor wafer in accordance with some embodiments of the instant disclosure.

Reference is made to FIG. 2. The substrate mounting assembly 130 includes a substrate mounting member 132 and a contact ring 134. When a semiconductor wafer 200 is mounted on the substrate mounting member 132, the contact ring 134 makes direct contact with the semiconductor wafer 200 through a plurality of contact pins 134a. The contact ring 134 is made of electrically conductive material, and the direct contact between the contact pins 134a and the semiconductor wafer 200 allows electrical current to travel. In some embodiments, the contact ring 134 is in a ring shape that has a smaller diameter than the semiconductor wafer 200. The contact pins 134a are short posts that project outwardly from the contact ring 134. The contact ring 134 goes along the edge of the semiconductor wafer 200, and the remaining area of the semiconductor wafer 200 is exposed. In some embodiments, the contact ring 134 makes direct contact with the back side of the semiconductor wafer 200. In some embodiments, as shown in FIG. 2, the contact ring 134 makes direct contact with the front side of the semiconductor wafer 200.

Reference is made to FIG. 1 again. In some embodiments, the semiconductor wafer 200 is mounted on the substrate holder 150 and lower to an electrolyte bath 104. Examples of the materials of the semiconductor wafer 200 includes, but not limited to, silicon (Si), germanium (Ge), silicon germanium (SiGe), any III-V elements, and the like. An independent power unit (not shown) supplies current to the counter electrode 110 through conductive wire 112. A power unit (not shown) supplies current to the substrate contact ring 134 through conductive wire 136. The independent power unit that is electrically connected to the counter electrode 110 functions independently from the power unit connected to the substrate contact ring 134. The electrolyte bath 104 may be aqueous, semi-aqueous or solvent-base. The viscosity of the electrolyte bath 104 may vary depends on the chemicals in the solution. Examples of electrolyte bath solvent include, but not limited to, water ($H_2O$), alcohol, propylene carbonate (PC), dimethylsulfoxide (DMSO) or the like. For an acidic reaction condition, acidic additives are dissolved in the solvent in a dilution ratio between about 1/1 and 1/100,000. Examples of acidic additives include, but not limited to, HF, HCl, $H_2SO_4$, $H_3PO_4$, citric acid, maleic acid, carbonic acid, or the like. For a basic reaction condition, basic additives are dissolved in the solvent in a dilution ratio between about 1/1 and 1/100,000. Examples of basic additives include, but not limited to, $NH_4F$, $NH_4OH$, TMAH, or the like. A reaction temperature is controlled between about −20 degree Celsius and 165 degree Celsius. Examples of a material of the counter electrode 110 include but not limited to, polysilicon, carbon, TiN, platinum (Pt), or the like. The substrate holder 150 lower the semiconductor wafer 200 into the electrolyte bath 104, such that the semiconductor wafer 200 is entirely immersed in the electrolyte bath 104. The rotatable spindle 140 may bring the semiconductor wafer 200 into rotation during the process at different speed modes.

The resistivity and pH of the electrolyte bath 104 may be adjusted by the addition of the acidic or basic additives. The acidic or basic additives are held in separate chemical tanks and mixed in a mixing tank before they enter the reaction cell 102. For example, HF and $H_2SO_4$ are placed in two separate chemical tanks. When the valves are opened, HF liquid and $H_2SO_4$ liquid flow into the mixing tank. A stirring mechanism may be used in the mixing tank. Subsequently, the well mixed acidic chemicals are discharged from the mixing tank and entering the reaction cell 102. The acidic chemicals are then mixed with the solvent, for example, water in the reaction cell 102 to achieve desirable pH or resistivity. Different acidic and basic additives may be used in one cycle, and acidic and basic additives may be alternately used at different stages so as to create desirable reaction conditions in the reaction.

Figure 3:
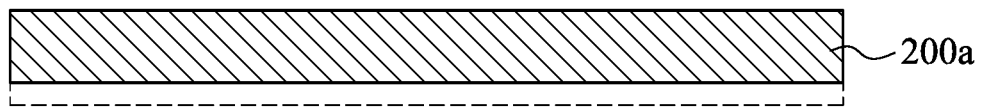
FIG. 3 is a schematic cross-sectional view of a semiconductor substrate partial removal process by an electrochemical apparatus in accordance with some embodiments of the instant disclosure.

Reference is made to FIG. 3. In some embodiments, the power unit provides a negative bias to the semiconductor wafer 200. The negative bias is larger than or equal to about −5.0V and smaller than 0.0V (−5.0V≤negative bias<0.0V). The semiconductor wafer 200 is the cathode in the electrochemical reaction. When the current is supplied to the counter electrode 110 of FIG. 1 and the semiconductor wafer 200, the surface oxide, including native oxide on the surface of the semiconductor wafer 200 is reduced. The semiconductor wafer 200 having reduced surface is annotated as 200a in FIG. 3. The dotted line of FIG. 3 shows the initial volume of the semiconductor wafer 200 before the electrochemical reaction. It should be understood that the reduced volume shown in FIG. 3 after the treatment is indicative and for illustration purpose only. The surface reduction of the semiconductor wafer 200 removes oxygen atoms from the substrate and results in high level of dangling bonds on the surface. For example, after the removal of hydroxyl group from Ge—OH, the remaining germanium atom on the substrate has a dangling bond (DB). The dangling bond has to be neutralized, or it may react with other particles and form into a molecule that causes device function failure. The hydrogen provided by the electrolyte bath 104 neutralizes the dangling bonds such that the germanium atom is passivated and will not form into other molecules.

Figure 5:
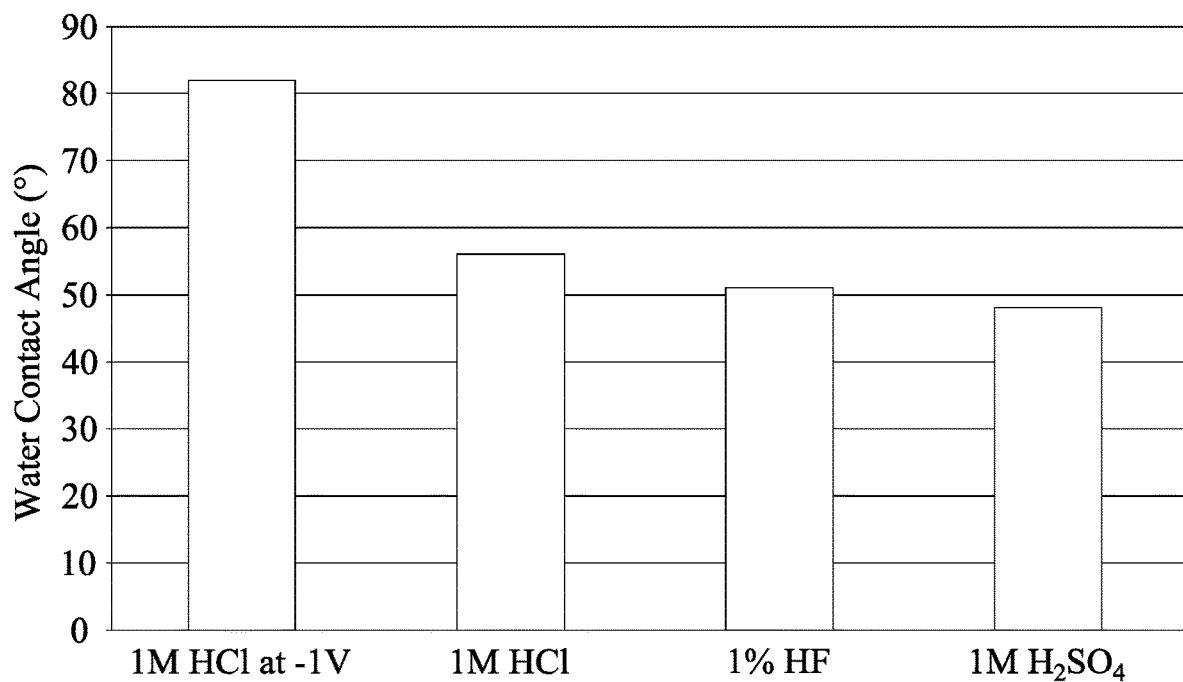
FIG. 5 is a graph illustrating a comparison of native oxide removal process with and without electrochemical apparatus.
Figure 6A:
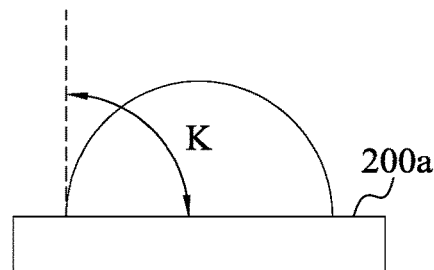
FIGS. 6A through 6D are schematic view of water contact angle on a semiconductor substrate surface after native oxide removal process with and without electrochemical apparatus.
Figure 6B:
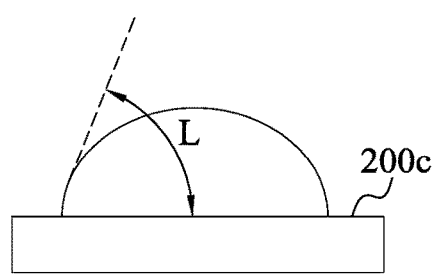
Figure 6C:
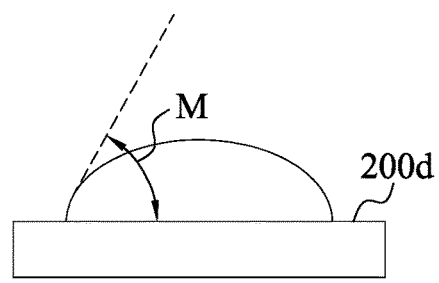
Figure 6D:
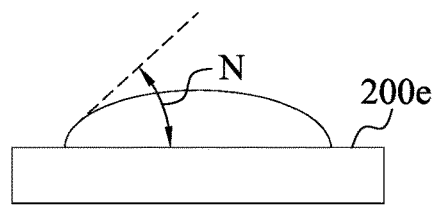

Reference is made to FIGS. 5 through 6D. FIG. 5 illustrates a graph plotting different reaction conditions against water contact angle to the semiconductor wafer. There are four examples, including the semiconductor wafer 200a that is treated in an electrolyte of 1M HCl and a negative bias at −1.0V in the electrochemical apparatus 100. A semiconductor wafer 200c is treated with 1M HCl in liquid without applying electrical current. A semiconductor wafer 200d is treated with 1 wt % HF in liquid without applying electrical current. A semiconductor wafer 200e is treated with 1M $H_2SO_4$ in liquid without applying electrical current. The degree of water contact angle to the semiconductor substrate surface indicates the level of hydrophobicity. After the removal of surface oxide from the semiconductor wafer, a high level of hydrophobicity suggests the successful removal of hydroxyl group (—OH) from the surface. On the other hand, if the semiconductor substrate surface remains highly hydrophilic (i.e., a low level of hydrophobicity), the outcome of surface oxide removal is poor. If a substrate surface is hydrophobic, the water contact angle is larger because the droplet retains its integrity. If a substrate surface is hydrophilic, the water contact angle is smaller because the droplet is more likely to be broken down by the hydrophilic molecules on the surface.

FIG. 5 shows semiconductor wafer 200a has the highest water contact angle of approximately 82° after surface oxide removal. A schematic diagram of a water droplet on the surface of semiconductor wafer 200a is shown in FIG. 6A, and the water contact angle is denoted as angle K. The 1M HCl liquid treated semiconductor wafer 200c has a water contact angle L of approximately 56° shown in FIG. 6B. The 1 wt % HF liquid treated semiconductor wafer 200d has a water contact angle M of approximately 52° shown in FIG. 6C. The 1M $H_2SO_4$ liquid treated semiconductor wafer 200e has a water contact angle N of approximately 46° shown in FIG. 6D. As previously discussed, the larger water contact angle implies a more hydrophobic substrate surface. The semiconductor wafer 200a shows an almost two folds higher in water contact angle in comparison with 1M $H_2SO_4$ liquid treated semiconductor wafer 200e. By supplying negative bias to the semiconductor wafer 200a in the electrochemical apparatus 100, a great leap in water contact angle (i.e., hydrophobicity) is seen between the semiconductor wafers 200a and 200c which undergoes a mere treatment with 1M HCl liquid.

Figure 4:
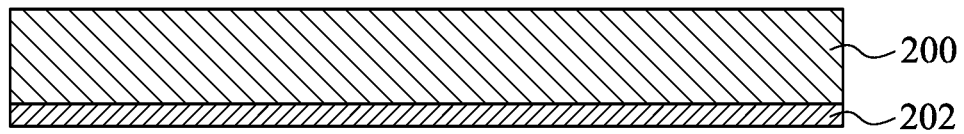
FIG. 4 is a schematic cross-sectional view of a semiconductor substrate partial growth process by an electrochemical apparatus in accordance with some embodiments of the instant disclosure.

Reference is made to FIG. 4. In some embodiments, a positive bias is supplied to the semiconductor wafer 200. The positive bias is larger than 0.0V and smaller than or equal to about 5.0V (0.0V<positive bias≤5.0V). When the current is supplied to the counter electrode 110 of FIG. 1 and the semiconductor wafer 200, oxidation takes place on the surface of the semiconductor wafer 200. As shown in FIG. 4, an oxide layer 202 is formed on the surface of the semiconductor wafer 200. This anodic oxidation can control the thickness of the resulting oxide layer 202 by manipulating the volume of electrical current.

Figure 7:
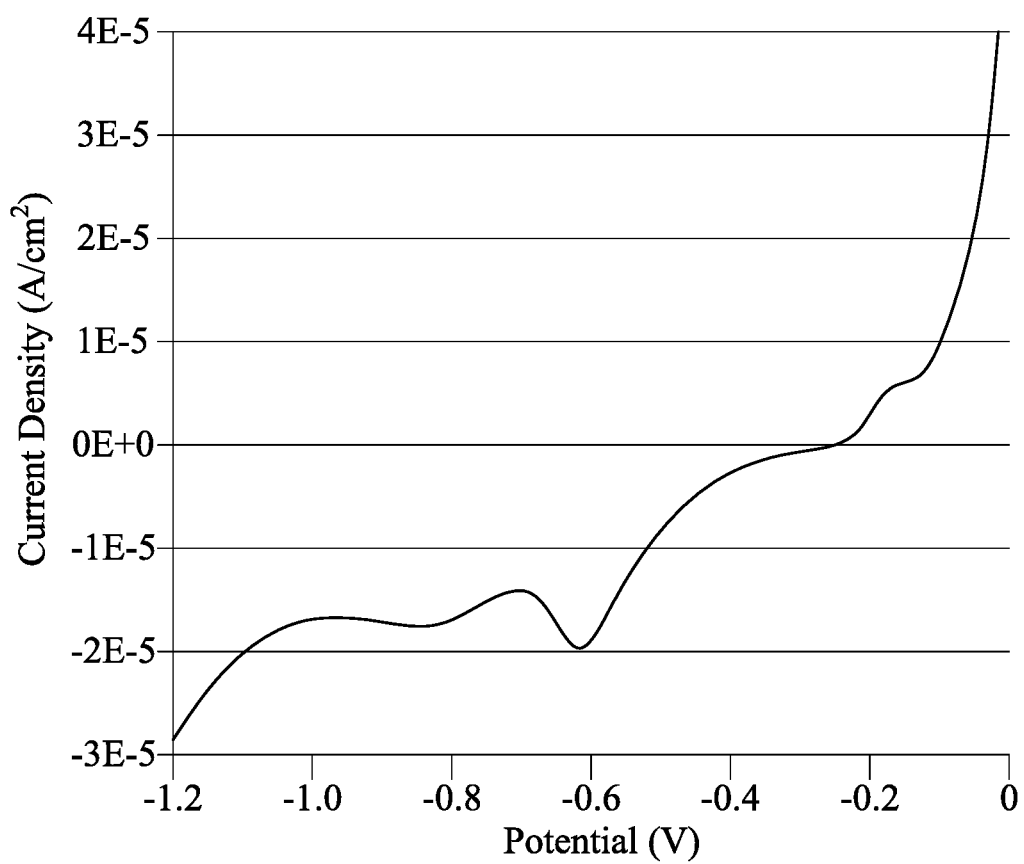
FIG. 7 is a graph illustrating a comparison of native oxide removal process with electrochemical apparatus at different bias.

Reference is made to FIG. 7, illustrating potential in voltage (V) plotting against current density in A/cm2. The bottom left shows the reduction (surface oxide removal) of semiconductor wafer, and the top right shows the oxidation (surface oxide formation) of semiconductor wafer. When the negative potential is of approximately −1.0V, the semiconductor substrate surface shows hydrophobic property as shown in FIG. 6A. As the negative potential goes further down to −1.2V, hydrogen termination (i.e., hydrogen atoms occupying dangling bonds) continues. In some embodiments, a dip is observed when the potential comes to of between approximately −0.6 and −0.7V. More specifically, during cyclic voltammetry of germanium in plane <100>, surface oxide, for example, Ge—OH is converted to Ge—H at this potential range. The hydrophobic property as shown in FIG. 6A can also be obtained. When the potential goes to about −0.5V, hydrophilic property gradually appears. The water contact angle at this potential reduces to less than about 19°. At about −0.3V, reduction of semiconductor wafer is converted to anodic oxidation. The semiconductor substrate surface is more hydrophilic than hydrophobic because of a large amount of hydroxyl groups on the surface, for example.

In addition to the treatment to the semiconductor wafer, the crystal structure of the semiconductor wafer also shows different outcomes. For example, between germanium in plane <100> and germanium in plane <111>, a shift of the curve may exist. More specifically, a curve of germanium in plane <111> may shift to the right along the X axis.

Figure 8:
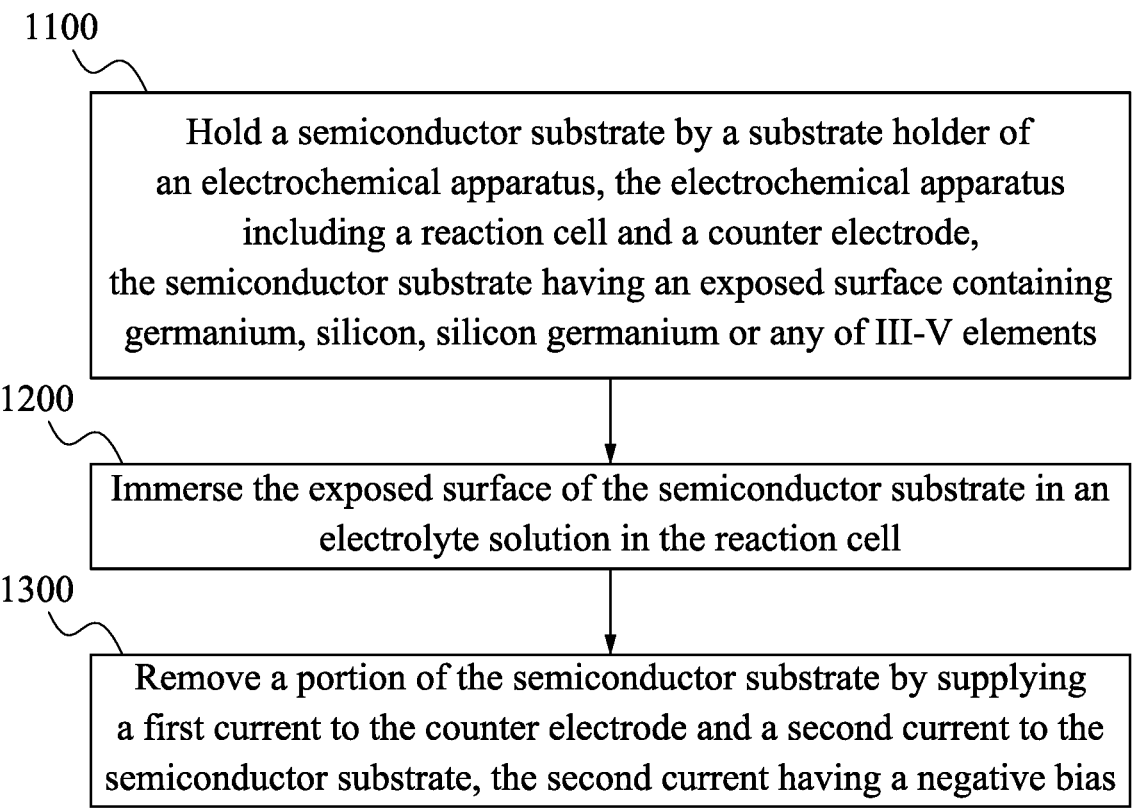
FIG. 8 is a flow chart illustrating a method of removing native oxide from a semiconductor substrate in accordance with some embodiments of the instant disclosure.

Reference is made to FIG. 8, illustrating a flow chart of a method 1000 of cleaning a semiconductor substrate. The method begins with operation 1100 in which a semiconductor substrate is held by a substrate holder of an electrochemical apparatus. The electrochemical apparatus includes a reaction cell and a counter electrode. The semiconductor substrate has an exposed surface containing germanium, silicon, silicon germanium or any of III-V elements. The method continues with operation 1200 in which the exposed surface of the semiconductor substrate is immersed in an electrolyte solution in the reaction cell. Subsequently, operation 1300 is performed. A portion of the semiconductor substrate is removed by supplying a first current to the counter electrode and a second current to the semiconductor substrate, the second current having a negative bias. The discussion that follows illustrates embodiments of semiconductor devices that can be fabricated according to the method 1000 of FIG. 8. While method 1000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 9A:
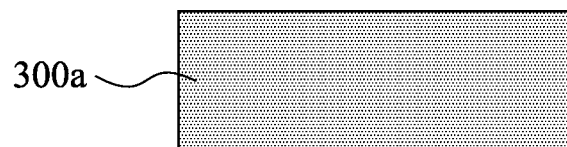
FIGS. 9A through 9C are cross-sectional views illustrating various stages of removing native oxide with electrochemical apparatus from a semiconductor substrate having silicon in accordance with some embodiments of the instant disclosure.
Figure 9B:
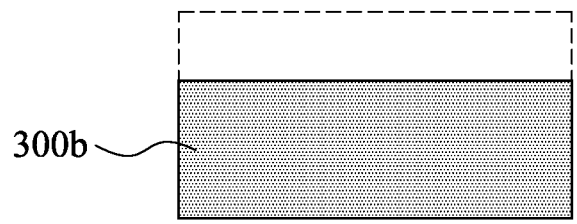
Figure 9C:
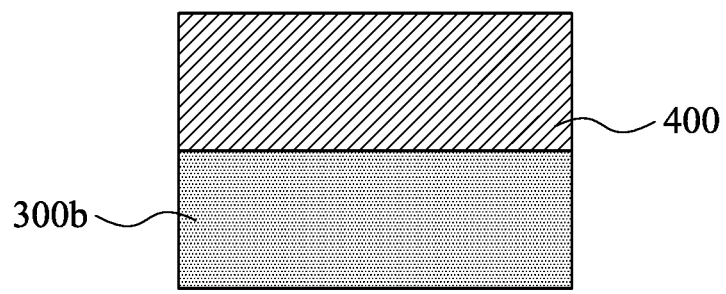

Reference is made to FIGS. 9A through 9C. As shown in FIG. 9A, a semiconductor substrate 300a containing silicon is provided. Next, a cleaning process is performed by immersing the semiconductor substrate 300a in the electrolyte bath 104 of FIG. 1 and applying a negative bias to the semiconductor substrate 300a. The surface of the semiconductor substrate 300a undergoes oxide removal and hydrogen termination to form a reduced semiconductor substrate 300b shown in FIG. 9B. This process may be seen as surface digital etch without switching between different reaction conditions. The reduced semiconductor substrate 300b has less surface oxide (native oxide) in comparison with the semiconductor substrate 300a due to the electrochemical cleaning. The semiconductor substrate 300b is more hydrophobic and suitable for epitaxial deposition. Subsequently, an epitaxial deposition is performed to form a silicon germanium (SiGe) layer 400 on the semiconductor substrate 300b shown in FIG. 9C.

Figure 10A:
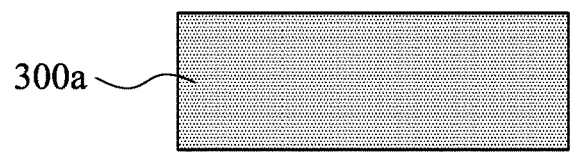
FIGS. 10A through 10G are cross-sectional views illustrating various stages of removing native oxide with electrochemical apparatus from a semiconductor substrate having silicon in accordance with some embodiments of the instant disclosure.
Figure 10B:
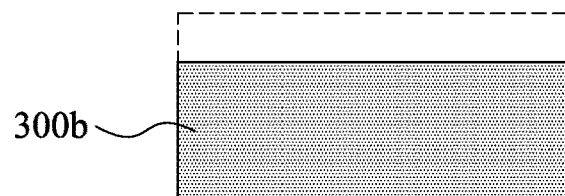
Figure 10C:
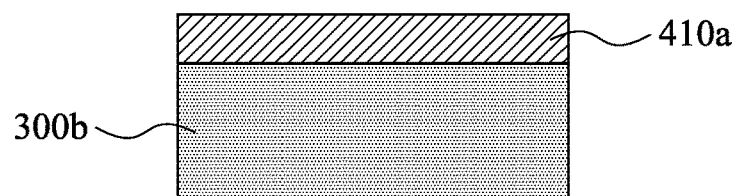
Figure 10D:
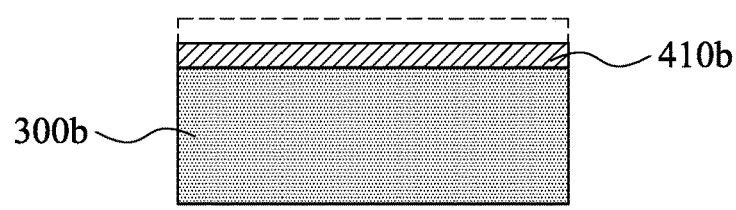
Figure 10E:
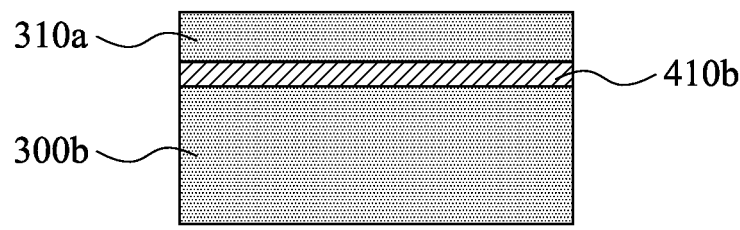
Figure 10F:
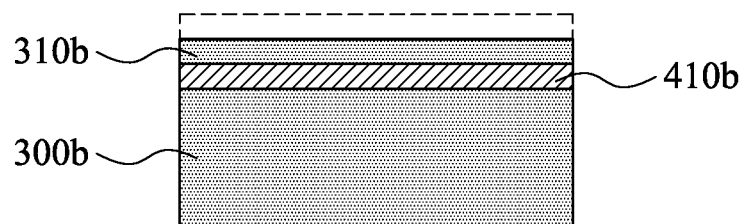
Figure 10G:
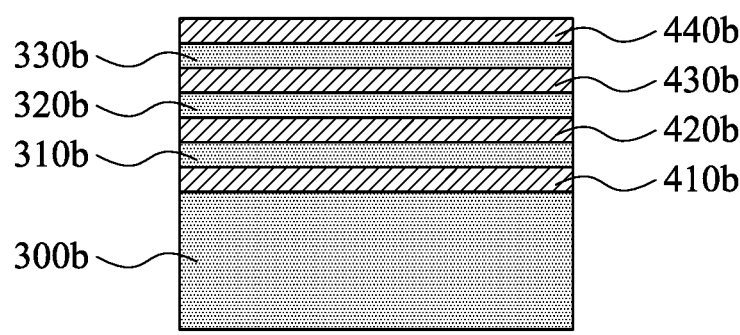

Reference is made to FIGS. 10A through 10G. A process of fabricating nanowire with alternate silicon and silicon germanium deposition is illustrated. As shown in FIGS. 10A and 10B, the semiconductor substrate 300a undergoes electrochemical cleaning process to form the semiconductor substrate 300b having low level of surface oxide. Subsequently, as shown in FIG. 10C, an epitaxial deposition is performed to form a silicon germanium (SiGe) layer 410a on the semiconductor substrate 300b. The electrochemical cleaning process is applied to the SiGe layer 410a, in which a negative bias is supplied to the semiconductor substrate 300b in the electrolyte bath 104 of FIG. 1. The surface oxide (native oxide) on the SiGe layer 410a is removed to form a reduced SiGe layer 410b as shown in FIG. 10D. Following that, a silicon (Si) layer 310a is epitaxially grown on the reduced SiGe layer 410b as shown in FIG. 10E. The Si layer 310a contains the same material as the semiconductor substrate 300b. Next, reference is made to FIG. 10F. The silicon layer 310a undergoes electrochemical cleaning process to remove surface oxide. The electrolyte bath 104 contains similar chemicals used for cleaning the SiGe layer 410b. The reaction condition remains substantially the same during each of the cleaning process. In order to form nanowire stack 300, Si layers 310b, 320b, and 330b and SiGe layers 410b, 420b, 430b, and 440b are stacked alternately as shown in FIG. 10G. Before the deposition of the Si layers 310b, 320b, and 330b and SiGe layers 410b, 420b, 430b, and 440b, their underlying layer undergoes electrochemical cleaning process to remove surface oxide and provide a hydrophobic surface for epitaxy.

Figure 11A:
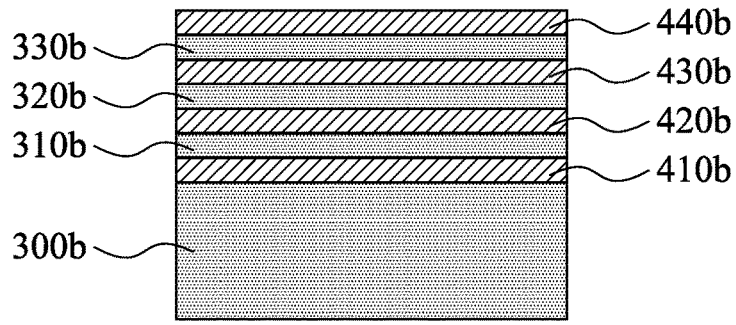
FIGS. 11A through 11C are cross-sectional views illustrating various stages of forming nanowires with electrochemical apparatus on a semiconductor substrate having silicon in accordance with some embodiments of the instant disclosure.
Figure 11B:
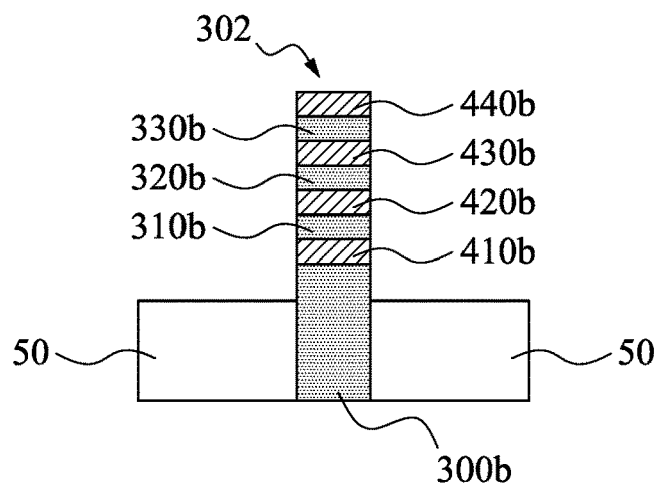
Figure 11C:
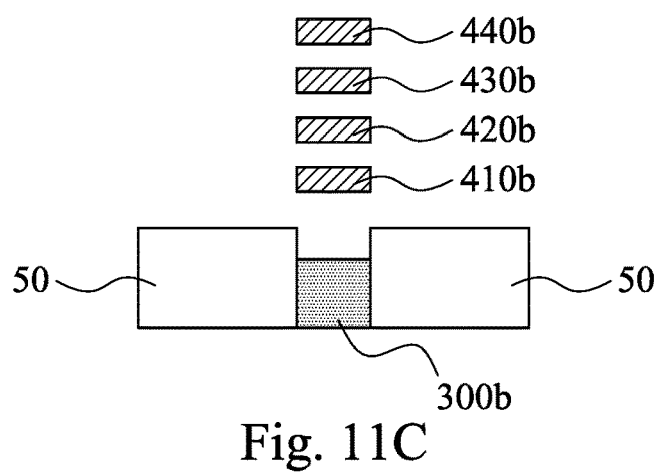

Reference is made to FIGS. 11A through 11C, illustrating a nanowire release process. The nanowire stack 300 shown in FIG. 11A undergoes nanowire release process. A dry etching process is performed such that the nanowire stack 300 is formed into a semiconductor fin 302 shown in FIG. 11B. Isolation structures 50 are formed on either side of the semiconductor fin 302. The Si layers 310b, 320b, and 330b and SiGe layers 410b, 420b, 430b, and 440b protrude upwardly and are exposed over the isolation structures 50. Subsequently, an electrical digital etch is performed in the electrochemical apparatus 100 of FIG. 1. In addition to the acidic or basic additives, the electrolyte bath 104 also contains $GeO_2$ of approximately between 0.01 and 10 wt %. The addition of $GeO_2$ increases the selectivity between Si layers and SiGe layers. More specifically, the Si layers 310b, 320b, and 330b are to be removed by electrochemical digital etching in the electrochemical apparatus 100 of FIG. 1. If the electrolyte bath 104 is saturated with germanium, SiGe layers 410b, 420b, 430b, and 440b are less likely to be consumed during Si layers 310b, 320b, and 330b removal. After the digital etching, the Si layers 310b, 320b, and 330b between the SiGe layers 410b, 420b, 430b, and 440b are completely removed. A portion of the semiconductor substrate 300b is consumed during the etching process. The SiGe layers 410b, 420b, 430b, and 440b remain as the nanowire main body. In some embodiments, the bias that is applied to the semiconductor substrate 300b has a smaller oxidation potential than the plane <110> and <100>. As a result, the nanowire release process creates a square-box like nanowire configuration as shown in FIG. 11C. By controlling the volume of oxidation potential, the configuration of the nanowire can be finely tuned.

Reference is made to FIGS. 12A through 12C. When the bias that is applied to the semiconductor substrate 300b has an oxidation potential larger than the plane <110> and plane <100> and smaller than the plane <111>, the SiGe layers 410c, 420c, 430c, and 440c shown in FIG. 12A are in a facetted configuration which has more edges than the SiGe layers 410b, 420b, 430b, and 440b. When the bias that is applied to the semiconductor substrate 300b has an oxidation potential larger than the plane <111>, the SiGe layers 410d, 420d, 430d, and 440d shown in FIG. 12B are in a facetted diamond configuration which are thinner than the SiGe layers 410c, 420c, 430c, and 440c. When the bias that is applied to the semiconductor substrate 300b has an oxidation potential larger than the plane <111> and larger than the oxidation potential applied to the SiGe layers 410c, 420c, 430c, and 440c, the SiGe layers 410e, 420e, 430e, and 440e shown in FIG. 12C are in a round configuration which has a curved, smooth outline.

Figure 13A:
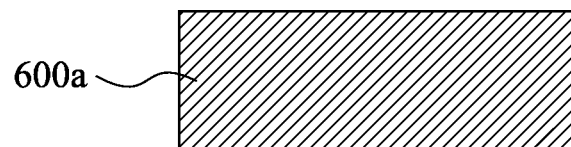
FIGS. 13A through 13C are cross-sectional views illustrating various stages of removing native oxide with electrochemical apparatus from a semiconductor substrate having silicon germanium in accordance with some embodiments of the instant disclosure.
Figure 13B:
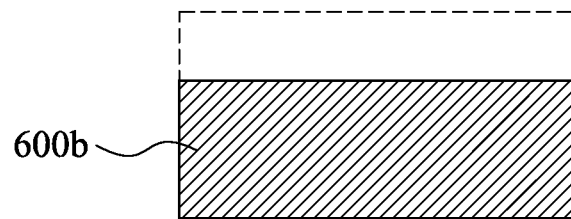
Figure 13C:
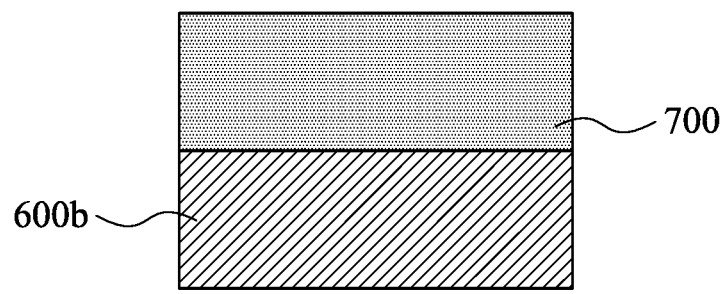

Reference is made to FIGS. 13A through 13C. As shown in FIG. 13A, a semiconductor substrate 600a containing silicon germanium is provided. Next, a cleaning process is performed by immersing the semiconductor substrate 600a in the electrolyte bath 104 of FIG. 1 and applying a negative bias to the semiconductor substrate 600a. The surface of the semiconductor substrate 600a undergoes oxide removal and hydrogen termination to form a reduced semiconductor substrate 600b shown in FIG. 13B. This process may be seen as surface digital etch without switching between different reaction conditions. The reduced semiconductor substrate 600b has less surface oxide (native oxide) in comparison with the semiconductor substrate 600a due to the electrochemical cleaning. The semiconductor substrate 600b is more hydrophobic and suitable for epitaxial deposition. Subsequently, an epitaxial deposition is performed to form a silicon germanium (SiGe) layer 700 on the semiconductor substrate 600b as shown in FIG. 13C.

Figure 14A:
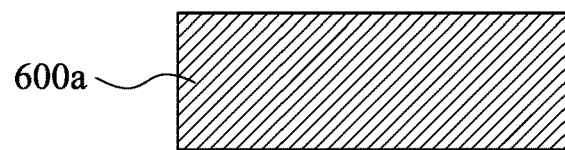
FIGS. 14A through 14G are cross-sectional views illustrating various stages of removing native oxide with electrochemical apparatus from a semiconductor substrate having silicon germanium in accordance with some embodiments of the instant disclosure.
Figure 14B:
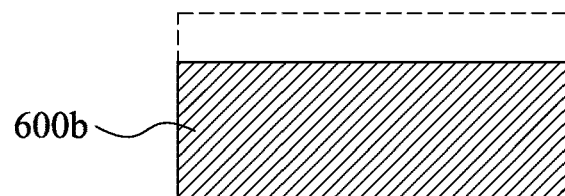
Figure 14C:
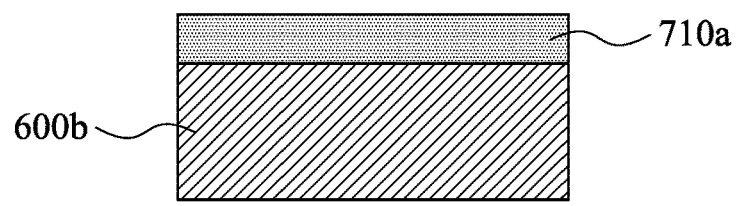
Figure 14D:
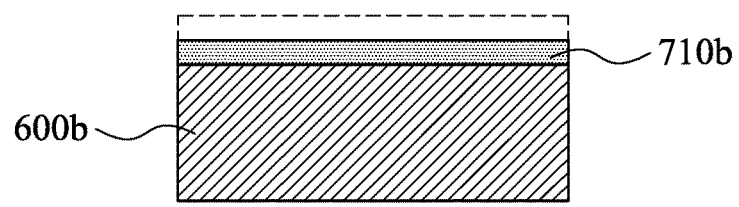
Figure 14E:
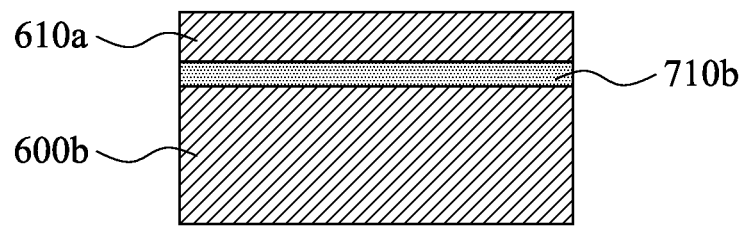
Figure 14F:
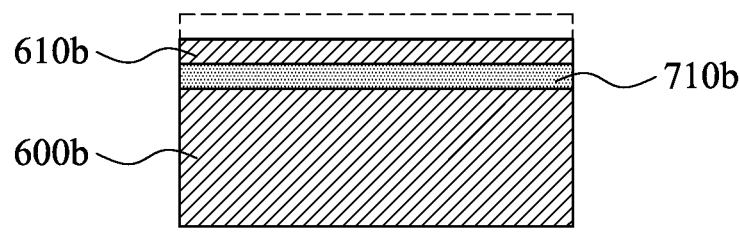
Figure 14G:
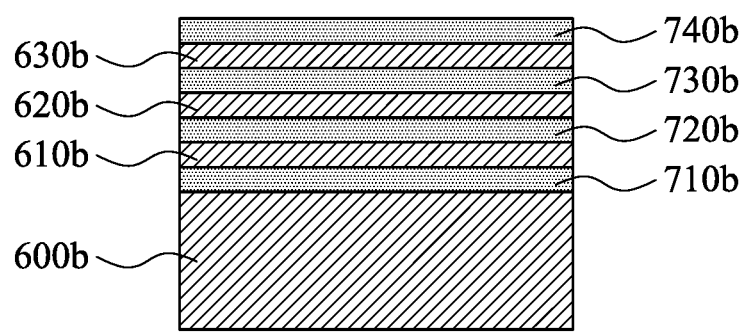

Reference is made to FIGS. 14A through 14G. A process of fabricating nanowire with alternate silicon germanium and silicon deposition is illustrated. As shown in FIGS. 14A and 14B, the semiconductor substrate 600a undergoes electrochemical cleaning process to form the semiconductor substrate 600b having low level of surface oxide. Subsequently, as shown in FIG. 14C, an epitaxial deposition is performed to form a silicon (Si) layer 710a on the semiconductor substrate 600b. The electrochemical cleaning process is then applied to the Si layer 710a, in which a negative bias is supplied to the semiconductor substrate 600b in the electrolyte bath 104 of FIG. 1. The surface oxide (native oxide) on the Si layer 710a is removed to form a reduced SiGe layer 710b as shown in FIG. 14D. Following that, a silicon germanium (SiGe) layer 610a is epitaxially grown on the reduced Si layer 710b as shown in FIG. 14E. The SiGe layer 610a contains the same material as the semiconductor substrate 600b. Next, reference is made to FIG. 14F. The SiGe layer 610a undergoes electrochemical cleaning process to remove surface oxide. The electrolyte bath 104 contains similar chemicals used for cleaning the Si layer 710b. The reaction condition remains substantially the same during each of the cleaning process. In order to form nanowires, SiGe layers 610b, 620b, and 630b and Si layers 710b, 720b, 730b, and 740b are stacked alternately as shown in FIG. 14G. Before the deposition of the SiGe layers 610b, 620b, and 630b and Si layers 710b, 720b, 730b, and 740b, their underlying layer undergoes electrochemical cleaning process to remove surface oxide and provide a hydrophobic surface for epitaxy.

Figure 15A:
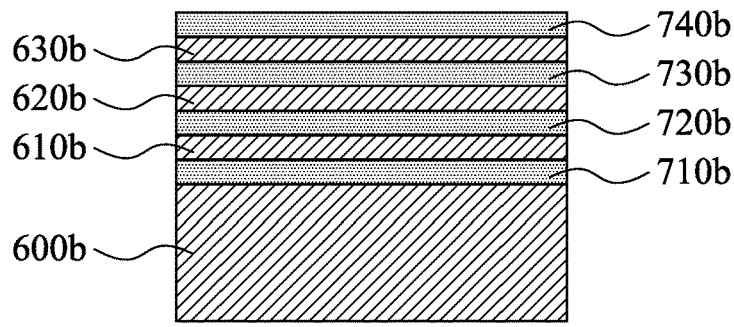
FIGS. 15A through 15C are cross-sectional views illustrating various stages of forming nanowires with electrochemical apparatus on a semiconductor substrate having silicon germanium in accordance with some embodiments of the instant disclosure.
Figure 15B:
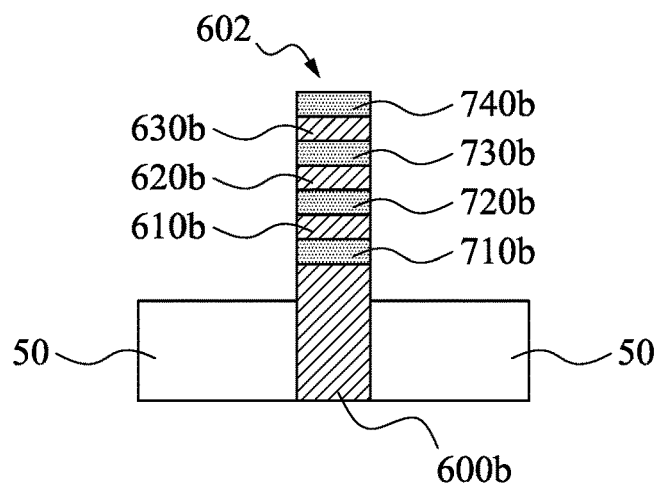
Figure 15C:
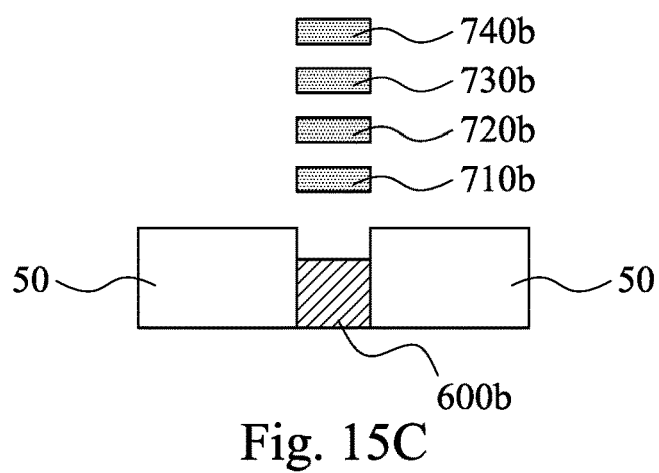

Reference is made to FIGS. 15A through 15C, illustrating a nanowire release process. The nanowire stack 600 shown in FIG. 15A undergoes nanowire release process. A dry etching process is performed such that the nanowire stack 600 is formed into a semiconductor fin 602 shown in FIG. 15B. Isolation structures 50 are formed on either side of the semiconductor fin 602. The SiGe layers 610b, 620b, and 630b and Si layers 710b, 720b, 730b, and 740b protrude upwardly and are exposed over the isolation structures 50. Subsequently, an electrical digital etch is performed in the electrochemical apparatus 100 of FIG. 1. In addition to the acidic or basic additives, the electrolyte bath 104 also contains $SiO_2$ of approximately between 0.01 and 10 wt %. The addition of $SiO_2$ increases the selectivity between SiGe layers and Si layers. More specifically, the SiGe layers 610b, 620b, and 630b are to be removed by electrochemical digital etching in the electrochemical apparatus 100 of FIG. 1. If the electrolyte bath 104 is saturated with silicon, Si layers 710b, 720b, 730b, and 740b are less likely to be consumed during SiGe layers 610b, 620b, and 630b removal. After the digital etching, the SiGe layers 610b, 620b, and 630b between the Si layers 710b, 720b, 730b, and 740b are completely removed. A portion of the semiconductor substrate 600b is consumed during the etching process. The Si layers 710b, 720b, 730b, and 740b remain as the nanowire main body. In some embodiments, the bias that is applied to the semiconductor substrate 600b has a smaller oxidation potential than the plane <110> and <100>. As a result, the nanowire release process creates a square-box like nanowire configuration as shown in FIG. 15C. By controlling the volume of oxidation potential, the configuration of the nanowire can be finely tuned.

Reference is made to FIGS. 16A through 16C. When the bias that is applied to the semiconductor substrate 600b has an oxidation potential larger than the plane <110> and plane <100> and smaller than the plane <111>, the Si layers 710c, 720c, 730c, and 740c shown in FIG. 16A are in a facetted configuration which has more edges than the Si layers 710b, 720b, 730b, and 740b. When the bias that is applied to the semiconductor substrate 300b has an oxidation potential larger than the plane <111>, the Si layers 710d, 720d, 730d, and 740d shown in FIG. 16B are in a facetted diamond configuration which are thinner than the Si layers 710c, 720c, 730c, and 740c. When the bias that is applied to the semiconductor substrate 600b has an oxidation potential larger than the plane <111> and larger than the oxidation potential applied to the Si layers 710c, 720c, 730c, and 740c, the Si layers 710e, 720e, 730e, and 740e shown in FIG. 16C are in a round configuration which has a curved, smooth outline.

Figure 17:
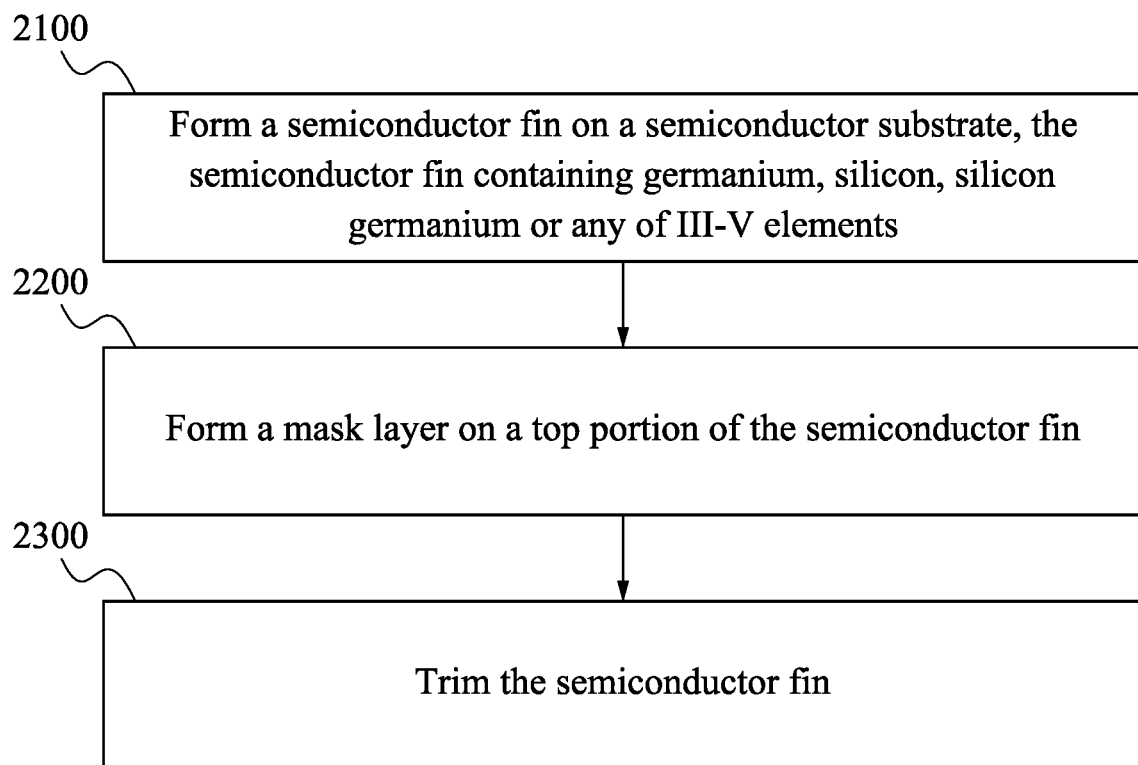
FIG. 17 is a flow chart illustrating a method of trimming a semiconductor fin in accordance with some embodiments of the instant disclosure.

Reference is made to FIG. 17, illustrating a flow chart of a method 2000 of trimming a semiconductor substrate. The method begins with operation 2100 in which a semiconductor fin is formed on a semiconductor substrate. The semiconductor fin contains germanium, silicon, silicon germanium or any of III-V elements. The method continues with operation 2200 in which a mask layer is formed on a top portion of the semiconductor fin. Subsequently, operation 2300 is performed. The semiconductor fin is trimmed. The discussion that follows illustrates embodiments of semiconductor devices that can be fabricated according to the method 2000 of FIG. 17. While method 2000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Reference is made to FIGS. 18A through 18C. A semiconductor fin 340a is formed by dry etching, for example. Then isolation structures 50 are formed on either side of the semiconductor fin 340a as shown in FIG. 18A. The semiconductor fin 340a contains silicon. A mask layer 60 is deposited on a top surface of the semiconductor fin 340a. The mask layer 60 may include SiN, SiO$_2$, or the like. The semiconductor fin 340a is immersed into the electrolyte bath 104 of FIG. 1 and undergoes trimming process in the electrochemical apparatus 100 of FIG. 1. A bias is applied to the semiconductor fin 340a, and the semiconductor fin 340a is etched laterally. Reference is made to FIG. 18B, the top portion of the semiconductor fin 340a is protected by the mask layer 60, and the height of the semiconductor fin 340a remains the same. A bottom portion 340b of the semiconductor fin which is level with the isolation structures 50 is less consumed during the electrochemical trimming process and its integrity is relatively intact. A stem portion 340c has a reduced width in comparison with the semiconductor fin 340a after the electrochemical trimming process. Reference is made to FIG. 18C. The mask layer 60 is then removed by, for example, high temperature H$_3$PO$_4$, HF, or the like. The configuration of the semiconductor fin can be controlled by using bias to the semiconductor wafer in the electrochemical trimming.

Reference is made to FIGS. 19A through 19C. After trimming, the stem portion 340c of the semiconductor fin has a narrower width than its bottom portion 340b as shown in FIG. 19A. Before formation of source/drain region, an electrochemical cleaning is performed to the stem portion 340c of the semiconductor fin so as to remove surface oxide on the stem portion 340c and allow hydrogen termination for a hydrophobic surface. As a result, a reduced stem portion 340d is formed as shown in FIG. 19B. Subsequently, source/drain region 72 is epitaxially formed on the reduced stem portion 340d shown in FIG. 19C. In some embodiments, the source/drain region 72 is highly doped SiP.

Reference is made to FIGS. 20A through 20C. A semiconductor substrate containing a silicon layer and a layer of silicon germanium overlying the silicon layer is pattern. The semiconductor substrate undergoes dry etching to form a SiGe semiconductor fin 640a and a bottom Si portion 340a as shown in FIG. 20A. Then isolation structures 50 are formed on either side of the bottom Si portion 340a and semiconductor fin 640a as shown in FIG. 20A. A mask layer 60 is deposited on a top surface of the SiGe semiconductor fin 640a, and the remaining portion of the SiGe semiconductor fin 640a is exposed. The bottom Si portion 340a is underlying the SiGe semiconductor fin 640a and between the isolation structures 50 such that it is not exposed during trimming. The mask layer 60 may include SiN, SiO$_2$, Si or the like. The SiGe semiconductor fin 640a is immersed into the electrolyte bath 104 of FIG. 1 and undergoes trimming process in the electrochemical apparatus 100 of FIG. 1. A bias is applied to the SiGe semiconductor fin 640a, and the SiGe semiconductor fin 640a is etched laterally. Reference is made to FIG. 20B, the top portion of the SiGe semiconductor fin 640a is protected by the mask layer 60, and the height of the SiGe semiconductor fin 640a remains the same. A bottom portion 640b of the SiGe semiconductor fin which is level with the isolation structures 50 is less consumed during the electrochemical trimming process and its integrity is relatively intact. A stem portion 640c has a reduced width in comparison with the SiGe semiconductor fin 640a after the electrochemical trimming process. Reference is made to FIG. 20C. The mask layer 60 is then removed by, for example, high temperature H$_3$PO$_4$, HF, diluted NH$_4$OH, or the like. The configuration of the semiconductor fin can be controlled by using bias to the semiconductor wafer in the electrochemical trimming.

Figure 21A:
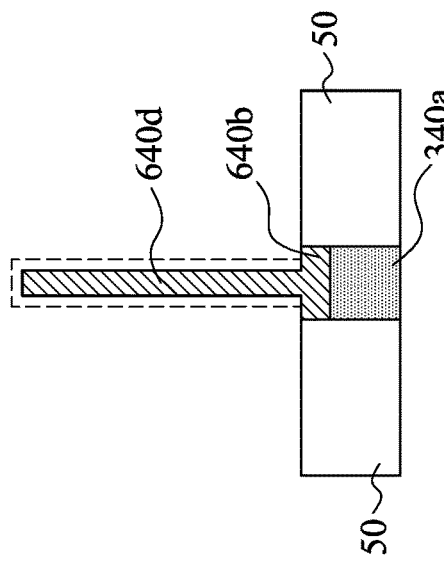
FIGS. 21A through 21D are cross-sectional views illustrating processing semiconductor fin having silicon germanium with electrochemical apparatus in accordance with some embodiments of the instant disclosure.
Figure 21B:
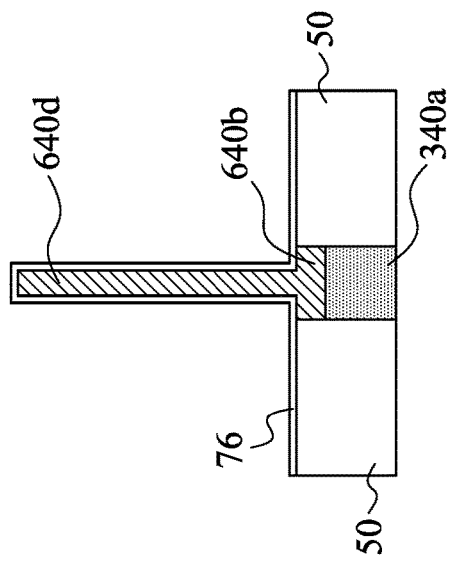
Figure 21C:
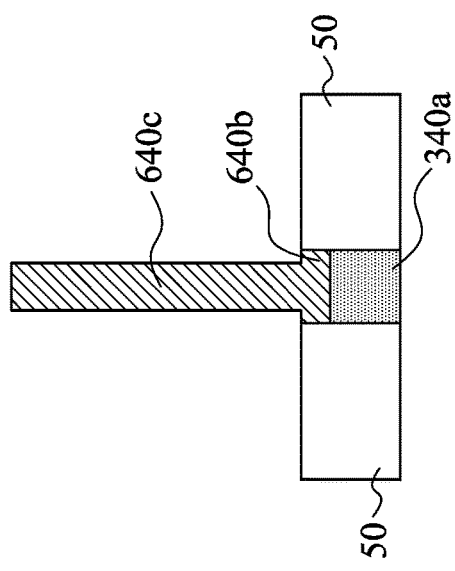
Figure 21D:
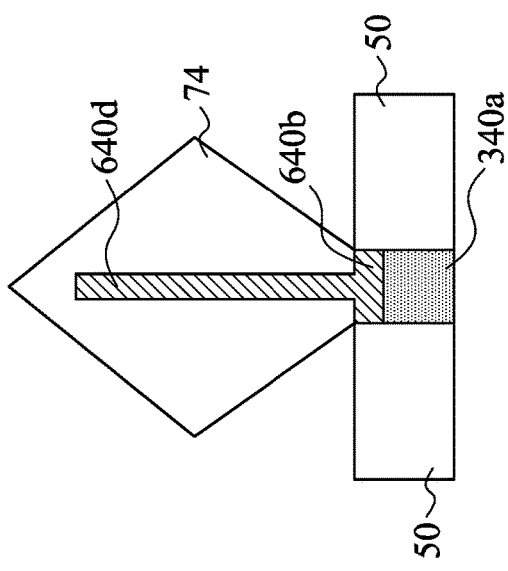

Reference is made to FIGS. 21A through 21D. After trimming, the stem portion 640c of the semiconductor fin has a narrower width than its bottom portion 640b as shown in FIG. 21A. Before formation of source/drain region, an electrochemical cleaning is performed to the stem portion 640c of the semiconductor fin so as to remove surface oxide on the stem portion 640c and allow hydrogen termination for a hydrophobic surface. As a result, a reduced stem portion 640d is formed as shown in FIG. 21B. Subsequently, source/drain region 74 is epitaxially formed on the reduced stem portion 340d shown in FIG. 21C. In some embodiments, the source/drain region 74 is highly doped SiGe. Reference is made to FIG. 21D. In some embodiments, a Si cap layer 76 is deposited on the reduced stem portion 640d by epitaxy or chemical vapor deposition (CVD).

Figure 22:
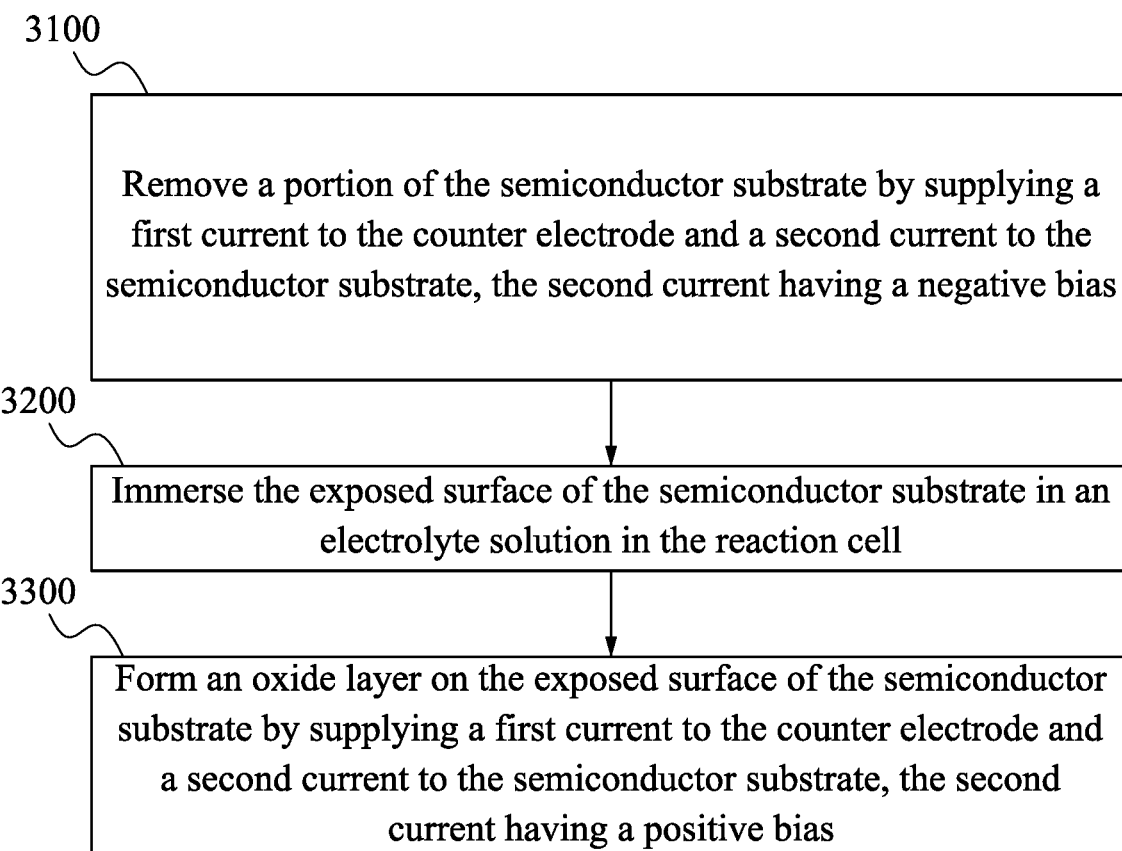
FIG. 22 is a flow chart illustrating interfacial layer formation process with electrochemical apparatus in accordance with some embodiments of the instant disclosure.

Reference is made to FIG. 22, illustrating a flow chart of a method 3000 of forming an oxide layer on a semiconductor substrate. The method begins with operation 3100 in which a semiconductor substrate is held by a substrate holder of an electrochemical apparatus. The electrochemical apparatus includes a reaction cell and a counter electrode. The semiconductor substrate has an exposed surface containing germanium, silicon, silicon germanium or any of III-V elements. The method continues with operation 3200 in which the exposed surface of the semiconductor substrate is immersed in an electrolyte solution in the reaction cell. Subsequently, operation 3300 is performed. An oxide layer is formed on the exposed surface of the semiconductor substrate by supplying a first current to the counter electrode and a second current to the semiconductor substrate. The second current has a positive bias. The discussion that follows illustrates embodiments of semiconductor devices that can be fabricated according to the method 3000 of FIG. 22. While method 3000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 23A:
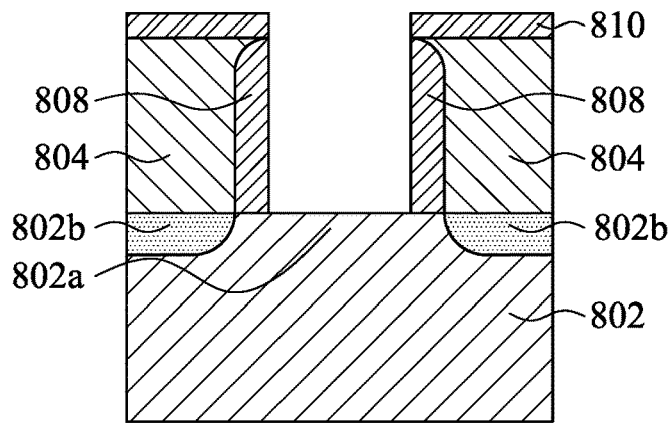
FIGS. 23A through 23C are cross-sectional views illustrating interfacial layer formation with electrochemical apparatus at various stages in accordance with some embodiments of the instant disclosure.
Figure 23B:
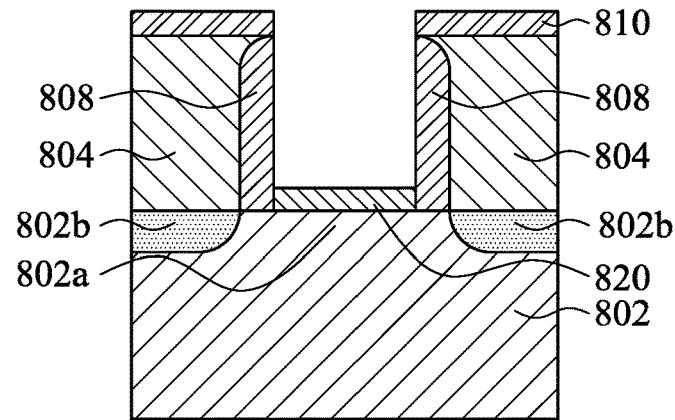
Figure 23C:
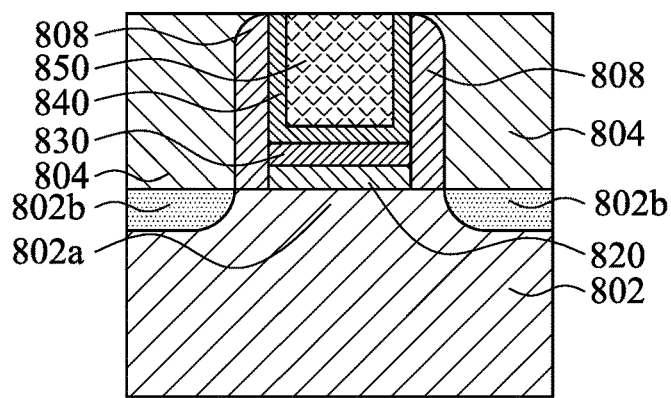

A process of manufacturing a high-k metal gate structure with electrochemical apparatus is illustrated in FIGS. 23A through 23C. Reference is made to FIG. 23A. A semiconductor substrate 802 containing silicon, silicon germanium, or any III-V elements is provided. A channel region 802a is defined in the semiconductor substrate 802, and spacers 808 are formed on either side of the channel region 802a. An interlayer dielectric layer 804 is deposited over the source/drain regions 802b. A mask layer 810 is formed on the interlayer dielectric layer 804, while the channel region 802a is exposed.

Reference is made to FIG. 23B. The semiconductor substrate 802 is immersed into the electrolyte bath 104 of the electrochemical apparatus 100 of FIG. 1, followed by positive bias supplied to the semiconductor substrate 802. The exposed channel region 802a of the semiconductor substrate 802 is then oxidized. The oxidation of semiconductor substrate 802 results in formation of an interfacial layer 820 on the channel region 802a. The interfacial layer 820 serves as the base for the subsequently formed high-k dielectric layer 830 and provides better adhesion thereto.

Reference is made to FIG. 23C. The mask layer 810 is removed. A high-k dielectric layer 830 is formed on the interfacial layer 820, followed by a barrier layer 840 conformingly formed in the space between the spacers 808. A metal gate electrode 850 is deposited on the barrier layer 840 to form a high-k metal gate structure.

Figure 24:
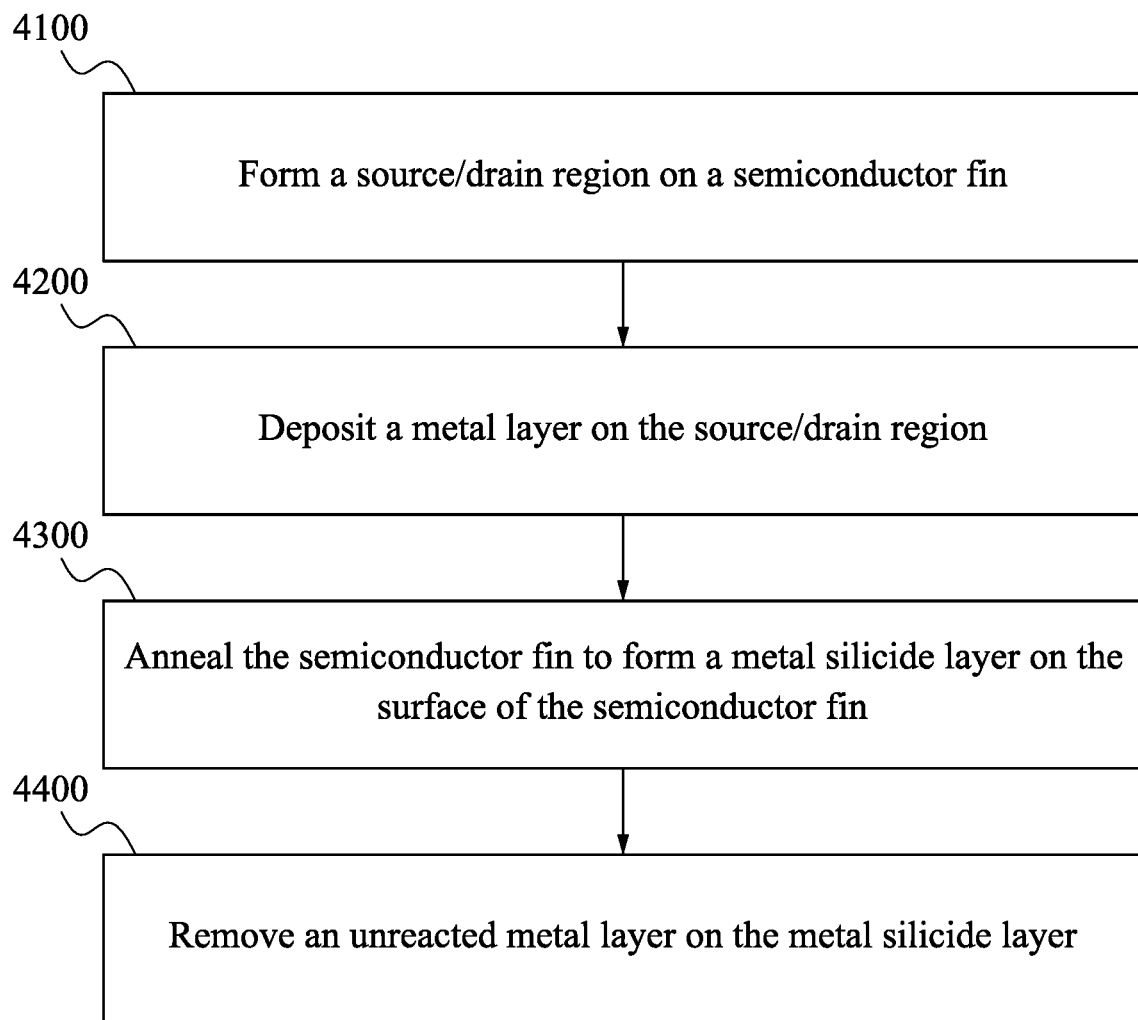
FIG. 24 is a flow chart illustrating removal of unreacted metal layer with electrochemical apparatus in accordance with some embodiments of the instant disclosure.

Reference is made to FIG. 24, illustrating a flow chart of a method 4000 of cleaning a semiconductor substrate. The method begins with operation 4100 in which a source/drain region is formed on a semiconductor fin. The method continues with operation 4200 in which a metal layer is deposited on the source/drain region. Subsequently, operation 4300 is performed. The semiconductor fin is annealed to form a metal silicide layer on the surface of the semiconductor fin. Next, with operation 4400 an unreacted metal layer is removed from the metal silicide layer. The discussion that follows illustrates embodiments of semiconductor devices that can be fabricated according to the method 4000 of FIG. 24. While method 4000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 25A:
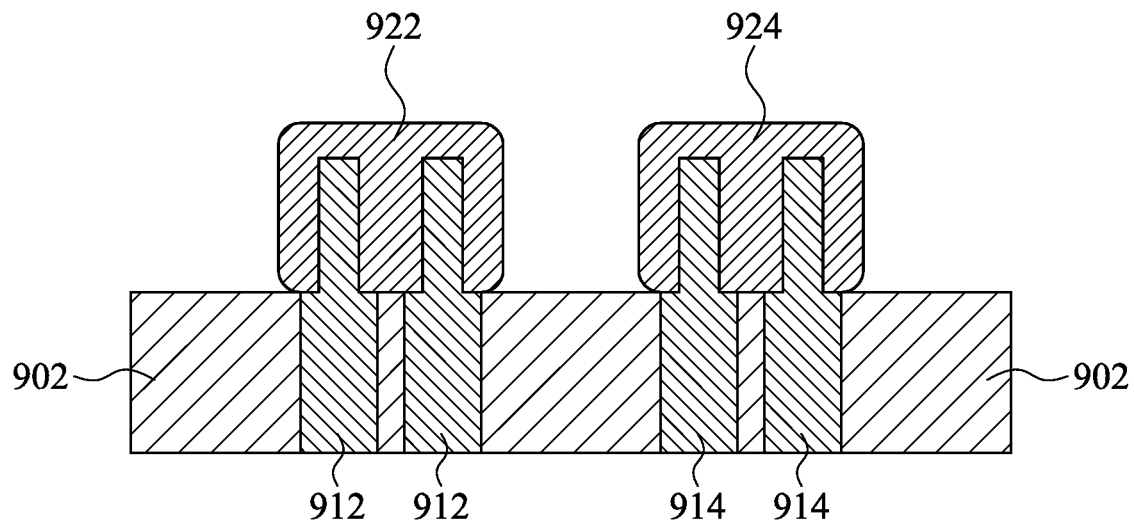
FIGS. 25A through 25D are cross-sectional views illustrating removal of unreacted metal layer with electrochemical apparatus at various stages in accordance with embodiments of the instant disclosure.
Figure 25B:
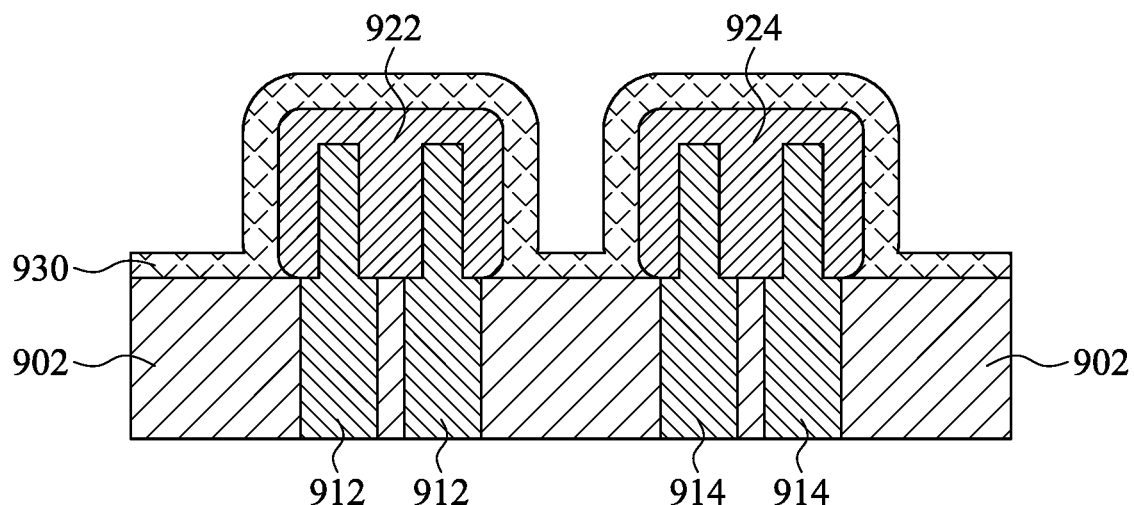
Figure 25C:
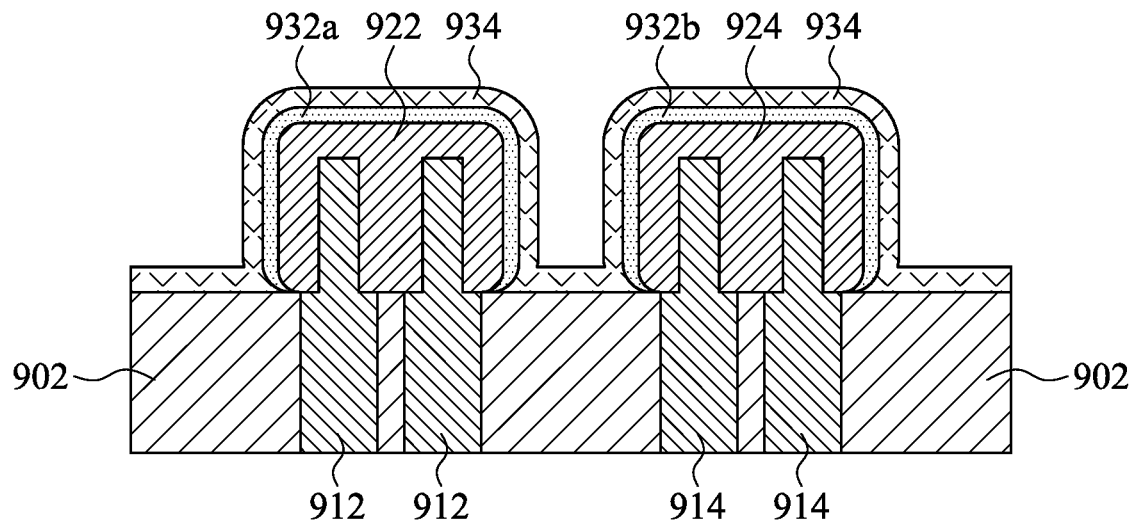

FIGS. 25A through 25C illustrate a process of silicide layer formation on source/drain region of a semiconductor substrate. Reference is made to FIG. 25A. Semiconductor fins 912 and 914 are formed between isolation structures 902. Source/drain regions 922 and 924 are formed on the semiconductor fins 912 and 914 respectively.

Reference is made to FIG. 25B. A metal layer 930 is conformingly deposited on the semiconductor substrate 902. The source/drain regions 922 and 924 are covered and in direct contact with the metal layer 930.

Reference is made to FIG. 25C. An annealing process is performed to the semiconductor substrate 902 such that a thin metal silicide layer 932a and 932b are formed at the interface between the source/drain regions 922 and 924 and the metal layer 930. The metal layer that is not in direct contact with underlying source/drain regions 922 and 924 are unreacted metal layer 934. The unreacted metal layer 934 conformingly coats the metal silicide layer 932a and 932b and on the semiconductor substrate 902.

Figure 25D:
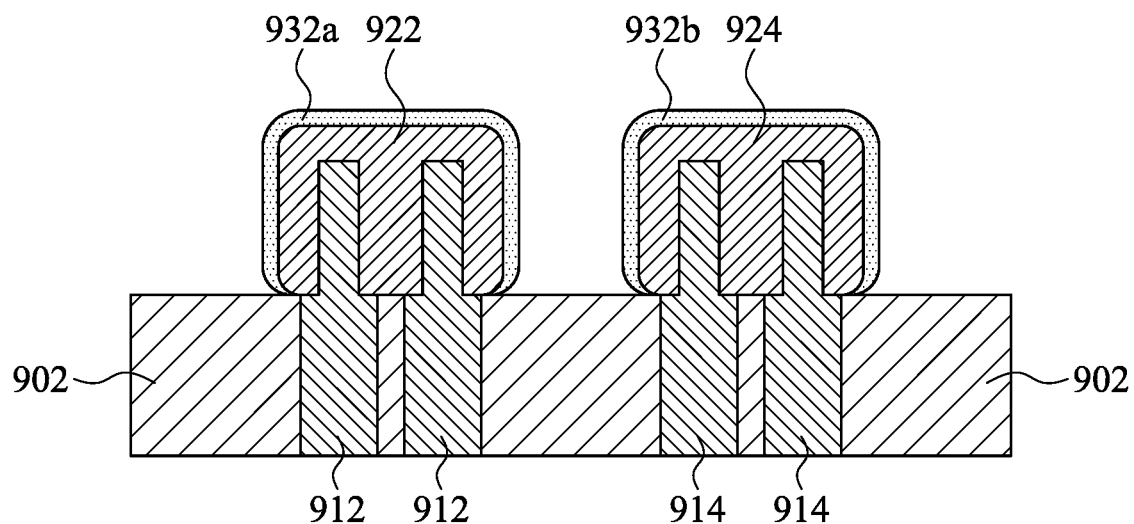

Reference is made to FIG. 25D. An unreacted metal removal process is performed with electrochemical apparatus 100 of FIG. 1. The semiconductor substrate is immersed in the electrolyte bath 104 of FIG. 1, and a bias is supplied to the semiconductor substrate to allow selective etching the unreacted metal layer 934. The unreacted metal layer 934 is then removed from the semiconductor substrate 902 and the underlying metal silicide layers 932a and 932b are exposed. In some embodiments, the metal silicide layers 932a and 932b are TiSi, and the unreacted metal layer 934 is Ti. In some embodiments, the metal silicide layers 932a and 932b are NiGe and NiInAs, and the unreacted metal layer 934 is Ni.

The surface oxide (native oxide) can be effectively removed by electrochemical process. By changing between negative and positive bias, the reduction reaction on the semiconductor surface is converted into oxidation. In the case of oxidation, oxide layer is formed on the semiconductor substrate. The electrochemical process can be applied to different materials including silicon and silicon germanium.

In some embodiments, a method includes depositing a plurality of first semiconductor layers and a plurality of second semiconductor layers over a substrate, wherein the first semiconductor layers and the second semiconductor layers are stacked alternately; patterning the first and second semiconductor layers to form a fin structure; supplying a first bias to the substrate after patterning the first and second semiconductor layers; and etching the second semiconductor layers when the semiconductor substrate is supplied with the first bias, wherein etching the second semiconductor layers is performed such that the first semiconductor layers are suspended above the substrate.

In some embodiments, a method includes forming a gate trench between two gate spacers over a semiconductor substrate, such that the gate trench exposes a portion of the semiconductor substrate; forming an interfacial layer in the gate trench between the gate spacers by supplying a positive bias to the semiconductor substrate to oxidize the exposed portion of the semiconductor substrate; and forming a gate structure over the interfacial layer to fill the gate trench.

In some embodiments, a method includes forming a source/drain region over a semiconductor substrate; depositing a metal layer over the source/drain region; annealing the semiconductor substrate to form a metal silicide layer by reacting the source/drain region with a portion of the metal layer; converting an unreacted portion of the metal layer into a metal oxide layer after annealing the semiconductor substrate by supplying a positive bias to the semiconductor substrate; and removing the metal oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    depositing a plurality of first semiconductor layers and a plurality of second semiconductor layers over a substrate, wherein the first semiconductor layers and the second semiconductor layers are stacked alternately;
    patterning the first and second semiconductor layers to form a fin structure;
    supplying a first bias to the substrate after patterning the first and second semiconductor layers; and
    etching the second semiconductor layers when the substrate is supplied with the first bias, wherein etching the second semiconductor layers is performed such that the first semiconductor layers are suspended above the substrate.

2. The method of claim 1, wherein etching the second semiconductor layers comprises:
    immersing the substrate in an electrolyte bath, wherein the electrolyte bath comprises a semiconductor material the same as that of the first semiconductor layers.

3. The method of claim 1, wherein the first bias is smaller than an oxidation potential of planes <110> and <100> of the first semiconductor layers.

4. The method of claim 1, wherein the first bias is larger than an oxidation potential of planes <110> and <100> of the first semiconductor layers and smaller than an oxidation potential of a plane <111> of the first semiconductor layers.

5. The method of claim 1, wherein the first bias is larger than an oxidation potential of a plane <111> of the first semiconductor layers.

6. The method of claim 1, further comprising:
removing a surface oxide on one of the first semiconductor layers and the second semiconductor layers during depositing the first semiconductor layers and the second semiconductor layers over the substrate, wherein removing the surface oxide comprises:
immersing the substrate in an electrolyte bath; and
supplying a second bias to the substrate, wherein the second bias is negative.

7. A method, comprising:
depositing a plurality of first semiconductor layers and a plurality of second semiconductor layers over a substrate, wherein the first semiconductor layers and the second semiconductor layers are stacked alternately;
patterning the first and second semiconductor layers to form a fin structure;
immersing the substrate and the fin structure in an electrolyte bath; and
supplying a first bias to the substrate when the substrate and the fin structure are immersed in the electrolyte bath.

8. The method of claim 7, wherein the electrolyte bath comprises an element the same as that of the first semiconductor layers.

9. The method of claim 7, wherein immersing the substrate and the fin structure in the electrolyte bath is performed such that at least one of the first semiconductor layers is etched to have a bottom side, a top side, and an edge facet connecting the bottom side to the top side.

10. The method of claim 7, wherein immersing the substrate and the fin structure in the electrolyte bath is performed such that at least one of the first semiconductor layers is etched to have a bottom side, a top side, and an edge side connecting the bottom side to the top side, wherein the edge side comprises an upper angled facet and a lower angled facet.

11. The method of claim 7, wherein immersing the substrate and the fin structure in the electrolyte bath is performed such that at least one of the first semiconductor layers is etched to have a bottom end, a top end, a first edge side connecting the bottom end to the top end, and a second edge side connecting the bottom end to the top end and opposite to the first edge side, wherein at least one of the first edge side and the second edge side comprises an upper angled facet and a lower angled facet.

12. The method of claim 7, wherein immersing the substrate and the fin structure in the electrolyte bath is performed such that at least one of the first semiconductor layers is etched to have a round configuration.

13. The method of claim 7, wherein supplying the first bias to the substrate is performed to induce an oxidation reaction in the electrolyte bath.

14. The method of claim 7, wherein supplying the first bias to the substrate comprises:
alternatively supplying the first bias and a second bias to the substrate to respectively induce oxidation and reduction reactions in the electrolyte bath, wherein the first bias is greater than the second bias.

15. A method, comprising:
patterning a semiconductor substrate to form a semiconductor fin;
forming an isolation structure surrounding the semiconductor fin;
etching a portion of the semiconductor fin such that a top surface of the portion of the semiconductor fin is lower than a top surface of the isolation structure; and
supplying a first bias to the semiconductor substrate during etching the portion of the semiconductor fin.

16. The method of claim 15, further comprising:
depositing a plurality of first semiconductor layers and a plurality of second semiconductor layer over the semiconductor substrate, such that the first semiconductor layers and the second semiconductor layers are stacked alternately prior to patterning the semiconductor substrate to form the semiconductor fin.

17. The method of claim 15, further comprising:
performing a cleaning process on the semiconductor substrate prior to patterning the semiconductor substrate to form the semiconductor fin, wherein the cleaning process comprises:
immersing the semiconductor substrate in an electrolyte bath; and
supplying a second bias to the semiconductor substrate when the semiconductor substrate is immersed in the electrolyte bath, wherein the second bias is negative.

18. The method of claim 17, wherein the cleaning process is performed to remove a surface oxide from the semiconductor substrate.

19. The method of claim 15, wherein supplying the first bias to the semiconductor substrate is performed to induce an oxidation reaction in an electrolyte bath.

20. The method of claim 15, wherein supplying the first bias to the semiconductor substrate comprises:
alternatively supplying the first bias and a third bias to the semiconductor substrate to respectively induce oxidation and reduction reactions in an electrolyte bath, wherein the first bias is greater than the third bias.

* * * * *